United States Patent
Ogiwara et al.

(10) Patent No.: US 9,460,785 B2
(45) Date of Patent: Oct. 4, 2016

(54) SEMICONDUCTOR STORAGE DEVICE

(71) Applicant: Kabushiki Kaisha Toshiba, Minato-ku (JP)

(72) Inventors: Ryu Ogiwara, Yokohama (JP); Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 107 days.

(21) Appl. No.: 14/482,198

(22) Filed: Sep. 10, 2014

(65) Prior Publication Data

US 2015/0255151 A1    Sep. 10, 2015

Related U.S. Application Data

(60) Provisional application No. 61/948,848, filed on Mar. 6, 2014.

(51) Int. Cl.
G11C 7/02 (2006.01)
G11C 13/00 (2006.01)
(Continued)

(52) U.S. Cl.
CPC ......... *G11C 13/004* (2013.01); *G11C 11/1673* (2013.01); *G11C 11/1675* (2013.01); *G11C 11/2273* (2013.01); *G11C 11/2275* (2013.01); G11C 11/1697 (2013.01); G11C 11/2297 (2013.01); G11C 13/0038 (2013.01);
(Continued)

(58) Field of Classification Search
CPC .......... G11C 13/004; G11C 11/1673; G11C 11/1675; G11C 11/2273; G11C 13/0069; G11C 13/0038

USPC .......... 365/207, 210.1, 189.08, 196, 189.07
See application file for complete search history.

(56) References Cited

U.S. PATENT DOCUMENTS 6,400,607 B1 * 6/2002 Pasotti ................... G11C 16/28
365/185.2
6,473,340 B1 * 10/2002 Pasotti ................ G11C 11/5642
365/185.03

(Continued)

FOREIGN PATENT DOCUMENTS

JP    11-297086    10/1999
JP    2003-178574    6/2003

(Continued)

OTHER PUBLICATIONS

Tz-Yi Liu et al. "A 130. 7mm² 2-layer 32Gb ReRAM Memory Device in 24nm Technology", ISSCC 2013/Session 12/Non-Volatile Memory Solutions/ 12.1, 2013, 3 pages.

(Continued)

Primary Examiner — Viet Q Nguyen
(74) Attorney, Agent, or Firm — Oblon, McClelland, Maier & Neustadt, L.L.P.

(57) ABSTRACT

A semiconductor storage device according to the present embodiment includes a constant current source. A reference current path is connected to the constant current source to flow a reference current and to generate a reference voltage. A supply current path or a plurality of supply current paths are connected to bit lines to selectively flow supply a current or currents different from each other and generate a detection voltage. A sense amplifier is connected to the reference current path and the supply current paths to amplify a voltage difference between the reference voltage and the detection voltage.

19 Claims, 26 Drawing Sheets

(51) Int. Cl.
*G11C 11/16* (2006.01)
*G11C 11/22* (2006.01)
(52) U.S. Cl.
CPC ... *G11C13/0069* (2013.01); *G11C 2013/0054* (2013.01); *G11C 2213/72* (2013.01); *G11C 2213/79* (2013.01)

(56) References Cited

U.S. PATENT DOCUMENTS

| | | | |
|---|---|---|---|
| 6,501,697 B1 | 12/2002 | Perner et al. | |
| 6,580,298 B1* | 6/2003 | Subramanian | G11C 7/062 327/52 |
| 6,700,814 B1* | 3/2004 | Nahas | G11C 7/06 365/158 |
| 6,781,873 B2 | 8/2004 | Ishikawa et al. | |
| 6,829,171 B2* | 12/2004 | Ooishi | G11C 11/5671 365/185.18 |
| 6,894,934 B2* | 5/2005 | De Santis | G11C 7/062 365/185.2 |
| 6,985,383 B2* | 1/2006 | Tang | G11C 5/147 365/148 |
| 7,142,457 B2* | 11/2006 | Lee | G11C 7/062 365/185.21 |
| 7,242,619 B2* | 7/2007 | Martines | G11C 16/28 365/185.2 |
| 7,554,861 B2* | 6/2009 | Vimercati | G11C 11/5642 365/189.06 |
| 7,869,260 B2 | 1/2011 | Ueda | |
| 8,040,718 B2 | 10/2011 | Ueda | |
| 8,059,480 B2* | 11/2011 | Lee | G11C 5/147 365/189.08 |
| 8,310,858 B2* | 11/2012 | Ito | G11C 5/147 365/148 |
| 8,587,984 B2* | 11/2013 | Ramani | G11C 11/5678 365/148 |
| 9,053,788 B2* | 6/2015 | Azuma | G11C 13/0064 |
| 2002/0118576 A1* | 8/2002 | Ohba | G11C 16/28 365/189.07 |
| 2004/0047207 A1* | 3/2004 | Mori | G11C 11/5642 365/202 |
| 2005/0249006 A1* | 11/2005 | Tran | G11C 11/5642 365/207 |
| 2006/0023531 A1* | 2/2006 | Crippa | G11C 11/5642 365/203 |
| 2006/0215463 A1* | 9/2006 | Vimercati | G11C 11/5642 365/189.07 |
| 2009/0237988 A1* | 9/2009 | Kurose | G11C 11/16 365/171 |
| 2011/0050330 A1* | 3/2011 | Miki | G11C 5/147 327/539 |
| 2015/0063048 A1* | 3/2015 | Lin | G11C 7/062 365/210.1 |

FOREIGN PATENT DOCUMENTS

| | | |
|---|---|---|
| JP | 2004-103060 | 4/2004 |
| JP | 2010-9711 | 1/2010 |
| JP | 2010-79974 | 4/2010 |
| JP | 2011-54232 | 3/2011 |
| JP | 2013-161502 | 8/2013 |

OTHER PUBLICATIONS

Youngdon Choi et al. "A 20nm 1.8V 8Gb PRAM with 40 MB/s Program Bandwidth", ISSCC 2012/ Session 2/ High Bandwidth DRAM & PRAM/2.5, 2012, 3 pages.

Tohru Furuyama et al. "A New Sense Amplifier Technique for VLSI Dynamic RAM's", IEDM 81, 1981, 5 pages.

Edmund J. Sprogis "A Technique for Measuring Threshold Mismatch in DRAM Sense Amplifier Devices", Proc. IEEE 1991 Int. Conference on Microelectronics Test Structures, vol. 4, No. 1, 1991, 4 pages.

Junji Tominaga et al. "Electrical-field induced giant magnetoresistivity in (non-magnetic) phase change films", Applied Physics Letters 99, 152105, 2011, 4 pages.

Yohji Watanabe et al. "Offset Compensating Bit-Line Sensing Scheme for High Density DRAM's" IEEE Journal of Solid-State Circuits, vol. 29, No. 1, 1994, 5 pages.

J. Tominaga et al. "The first Principle Computer Simulation and Real Device Characteristics of Superlattice Phase-Change Memory", IEDM, 20104 pages.

Shunichi Suzuki et al. "Threshold Difference Compensated Sense Amplifier", IEEE Journal of Solid-State Circuits, Vo. SC-14, No. 6, 1979, 5 pages.

* cited by examiner

SEMICONDUCTOR STORAGE DEVICE

CROSS REFERENCE TO RELATED APPLICATIONS

This application is based upon and claims the benefit of priority from the prior U.S. Provisional Patent Application No. 61/948,848, filed on Mar. 6, 2014, the entire contents of which are incorporated herein by reference.

FIELD

The embodiments of the present invention relate to a semiconductor storage device.

BACKGROUND

Semiconductor storage devices such as a NAND flash memory have been downscaled to increase storage capacities. To realize further downscaling, development of memories using new materials is progressed. For example, new memories such as a ReRAM (Resistance Random Access Memory), a PRAM (Phase-Change RAM) or a PCM (Phase-Change Memory), an iPCM (interfacial PCM), a FeNAND (Ferroelectric NAND-type memory), and an MRAM (Magnetic Random Access Memory) have been developed.

These new memories are of a type in which data is written or read by flowing a current to memory cells through a clamp transistor. Conventionally, however, because a reference potential to be used for data read is generated independently of the memory cells, the reference potential is set to a constant level completely regardless of variations in characteristics of the memory cells. Therefore, different levels of the reference potential need to be generated to correspond to the variations in the characteristics of the memory cells.

DETAILED DESCRIPTION

Embodiments will now be explained with reference to the accompanying drawings. The present invention is not limited to the embodiments.

A semiconductor storage device according to the present embodiment includes a constant current source. A reference current path is connected to the constant current source to flow a reference current and to generate a reference voltage. A supply current path or a plurality of supply current paths are connected to bit lines to selectively flow supply a current or currents different from each other and generate a detection voltage. A sense amplifier is connected to the reference current path and the supply current paths to amplify a voltage difference between the reference voltage and the detection voltage.

Embodiments of the present invention are applicable to any of current-detection memories such as a ReRAM, a PRAM or a PCM, an iPCM, a FeNAND, and an MRAM.

First Embodiment

Figure 1:
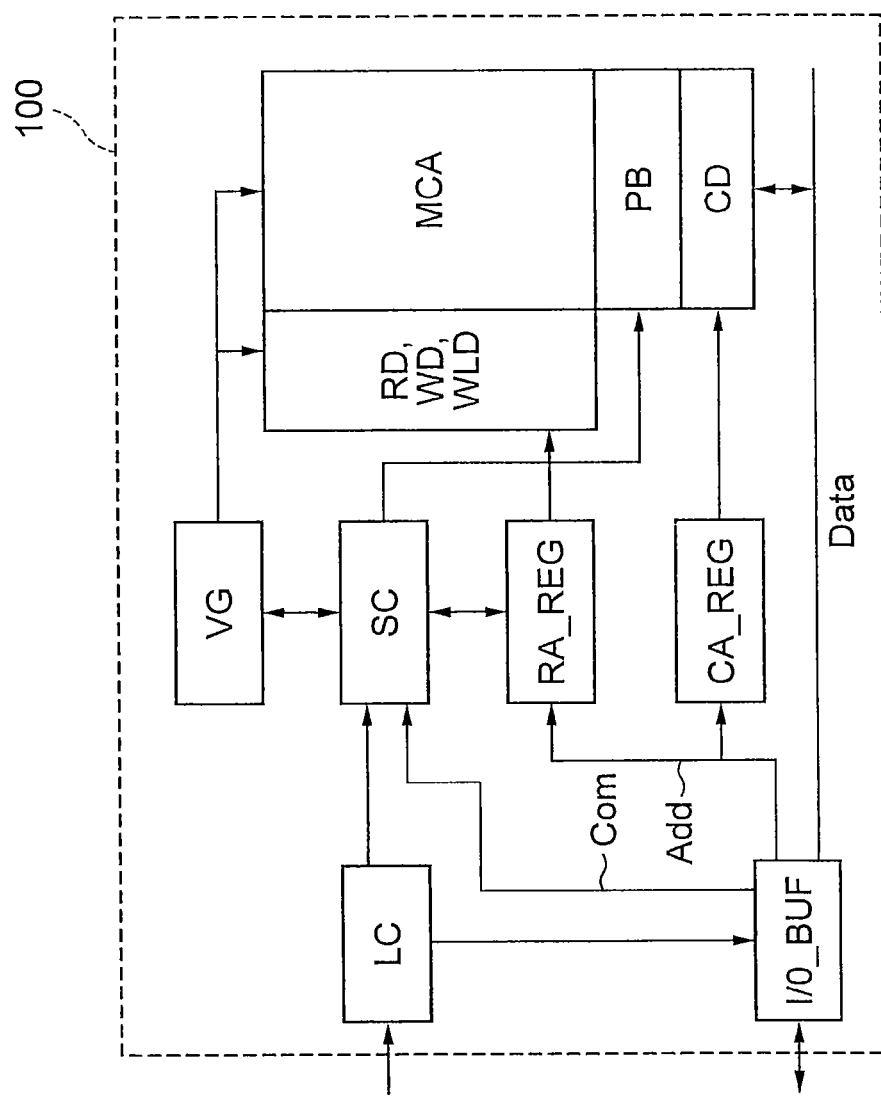
FIG. 1 is a block diagram showing an example of a configuration of a memory 100 according to a first embodiment.

FIG. 1 is a block diagram showing an example of a configuration of a memory 100 according to a first embodiment. The memory 100 includes a memory cell array MCA, a page buffer PB, a column decoder CD, a word line driver WLD (or a write driver WD), a row decoder RD, an internal-voltage generation circuit VG, a sequence controller SC, a logic controller LC, a row address register RA_REG, a column address register CA_REG, and an input/output buffer (hereinafter, "I/O buffer") I/O_BUF. The internal-voltage generation circuit VG includes a step-up circuit that generates a potential higher than a potential of an external power supply VDD using a charge pump circuit, a circuit that generates an internal step-down potential from an external power supply potential using a source-follower step-down transistor or a PMOS feedback circuit, a BGR (Band-Gap-Reference) circuit serving as a reference-potential generation circuit that generates a constant potential regardless of temperatures and power supply voltages, a power-on detector detecting that the external power supply rises to a predetermined voltage, and the like. While arrows clearly show supply of a step-up potential to the memory cell array MCA, the row decoder RD, and the word line driver WLD in FIG. 1, a step-down potential is also supplied to the page buffer PB, the column decoder CD, the sequence controller SC, the row address register RA_REG, and the column address register CA_REG.

The memory cell array MCA includes a plurality of memory cells MC two-dimensionally arranged in a matrix. The row decoder RD and the word line driver WLD (or a write driver WD) selectively step up a voltage of one of word lines of the memory cell array MCA and drive the selected word line.

The column decoder CD and the page buffer PB read data of a memory cell MC via a selected bit line or bit line pair and temporarily store therein the read data. The column decoder CD and the page buffer PB temporarily store therein write data and write the stored write data to a memory cell MC via a selected bit line or bit line pair. The page buffer PB includes a sense amplifier circuit and a data retention circuit and performs read and write of data in units of pages of the memory cell array MCA. The column decoder CD transfers the read data stored in the page buffer PB to the I/O buffer I/O_BUF with respect to each column. The column decoder CD transfers the write data transferred from the I/O buffer I/O_BUF to the page buffer PB with respect to each column.

The row address register RA_REG receives a row address signal via the I/O buffer I/O_BUF and holds the row address signal therein. The column address register CA_REG receives a column address signal via the I/O buffer I/O_BUF and holds the column address signal therein. The row address register RA_REG and the column address register CA_REG transfer the row address signal and the column address signal (hereinafter, also "address signal Add") to the row decoder RD and the column decoder CD, respectively.

Based on a control signal (hereinafter, also "command Com") such as a chip enable signal, a command enable signal, an address-latch enable signal, a write enable signal, or a read enable signal, the logic controller LC controls input of the command Com or the address signal Add and also controls input/output of data Data (read data or write data). A read operation or a write operation is performed according to the command Com. Upon reception of the command Com, the sequence controller SC executes a sequence control on read, write, or erase.

The internal-voltage generation circuit VG is controlled by the sequence controller SC and generates/supplies predetermined voltages required for various operations.

The I/O buffer I/O_BUF outputs the read data from the column decoder CD to outside or transfers the write data from outside to the column decoder CD. The I/O buffer I/O_BUF receives the command Com and the address signal Add.

Figure 2:
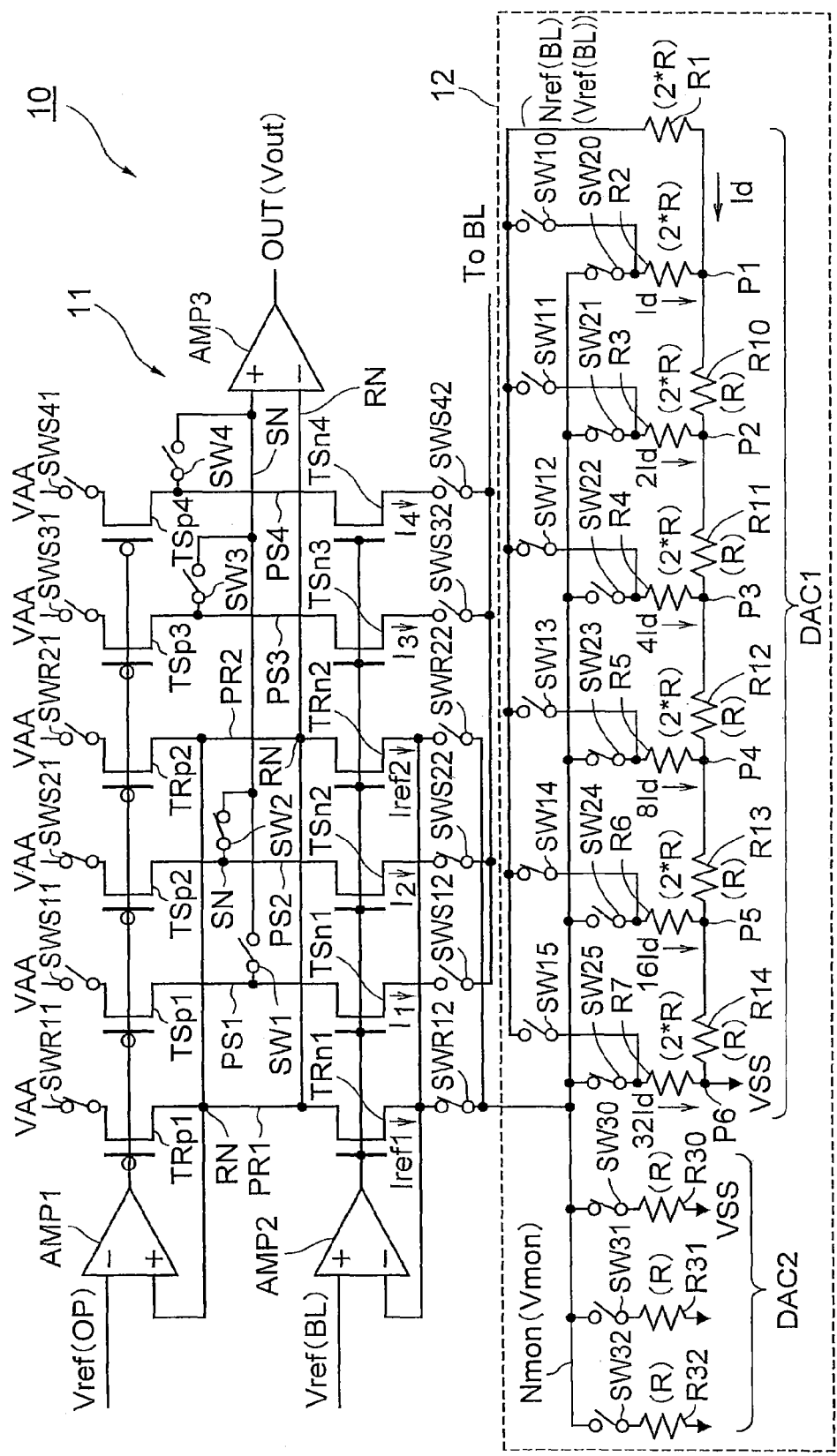
FIG. 2 is a circuit diagram showing an example of a configuration of a read/write driver 10 according to the first embodiment.

FIG. 2 is a circuit diagram showing an example of a configuration of a read/write driver 10 according to the first embodiment. The read/write driver 10 includes a current supply circuit 11 that supplies a current to one of bit lines BL, and a current generation circuit (constant current source) 12 that generates a reference current.

The current supply circuit 11 includes reference current paths PR1 and PR2, supply current paths PS1 to PS4, and operational amplifiers AMP1 to AMP3.

The reference current path PR1 is connected between an internal step-down power supply VAA and the current generation circuit 12 and has a P transistor TRp1 and an N transistor TRn1 connected in series. A switch SWR11 is placed between the internal step-down power supply VAA and the P transistor TRp1. A switch SWR12 is placed between the current generation circuit 12 and the N transistor TRn1.

The reference current path PR2 is connected between the internal step-down power supply VAA and the current generation circuit 12 and has a P transistor TRp2 and an N transistor TRn2 connected in series. A switch SWR21 is placed between the internal step-down power supply VAA and the P transistor TRp2. A switch SWR22 is placed between the current generation circuit 12 and the N transistor TRn2.

The supply current path PS1 is connected between the internal step-down power supply VAA and the bit lines BL and has a P transistor TSp1 and an N transistor TSn1 connected in series. A switch SWS11 is placed between the internal step-down power supply VAA and the P transistor TSp1. A switch SWS12 is placed between the bit lines BL and the N transistor TSn1.

The supply current path PS2 is connected between the internal step-down power supply VAA and the bit lines BL and has a P transistor TSp2 and an N transistor TSn2 connected in series. A switch SWS21 is placed between the internal step-down power supply VAA and the P transistor TSp2. A switch SWS22 is placed between the bit lines BL and the N transistor TSn2.

The supply current path PS3 is connected between the internal step-down power supply VAA and the bit lines BL and has a P transistor TSp3 and an N transistor TSn3 connected in series. A switch SWS31 is placed between the internal step-down power supply VAA and the P transistor TSp3. A switch SWS32 is placed between the bit lines BL and the N transistor TSn3.

The supply current path PS4 is connected between the internal step-down power supply VAA and the bit lines BL and has a P transistor TSp4 and an N transistor TSn4 connected in series. A switch SWS41 is placed between the internal step-down power supply VAA and the P transistor TSp4. A switch SWS42 is placed between the bit lines BL and the N transistor TSn4.

An inverting input of the operational amplifier AMP1 is connected to a reference potential Vref(OP). A non-inverting input of the operational amplifier AMP1 is connected to a reference node RN. The reference potential Vref(OP) is used by the operational amplifier AMP3 for data detection and is a medium potential between the internal step-down potential VAA and a reference potential Vref(BL). The reference node RN is connected in common between the transistors TRp1 and TRn1 and between the transistors TRp2 and TRn2. The reference node RN is connected to an inverting input of the operational amplifier AMP3 and transmits a reference potential to the operational amplifier AMP3. An output of the operational amplifier AMP1 is connected to gates of the P transistors TRp1, TRp2, and TSp1 to TSp4 in common.

An inverting input of the operational amplifier AMP2 is connected to a node between the reference current path PR1 and the current generation circuit 12 or to a node between the reference current path PR2 and the current generation circuit 12. A non-inverting input of the operational amplifier AMP2 is connected to the reference potential Vref(BL). The reference potential Vref(BL) is a potential of a selected bit line BL at the time of reading or writing and is obtained from a node Nref(BL) of the current generation circuit 12. An output of the operational amplifier AMP2 is connected to gates of the N transistors TRn1, TRn2, and TSn1 to TSn4 in common.

An inverting input of the operational amplifier AMP3 is connected to the reference node RN. A non-inverting input of the operational amplifier AMP3 is connected to the supply current paths PS1 to PS4 via switches SW1 to SW4, respectively.

The switch SW1 is connected between a node between the transistors TSp1 and TSn1 and the non-inverting input of the operational amplifier AMP3 (a sense node SN). The switch SW2 is connected between a node between the transistors TSp2 and TSn2 and the non-inverting input of the operational amplifier AMP3 (the sense node SN). The switch SW3 is connected between a node between the transistors TSp3 and TSn3 and the non-inverting input of the operational amplifier AMP3 (the sense node SN). The switch SW4 is connected between a node between the transistors TSp4 and TSn4 and the non-inverting input of the operational amplifier AMP3 (the sense node SN).

It is assumed that channel widths of the transistors TRp1, TRn1, TSp1 to TSp4, and TSn1 to TSn4 are WRp1, WRn1, WSp1 to WSp4, and WSn1 to WSn4, respectively, and that channel lengths of the transistors TRp1, TRn1, TSp1 to TSp4, and TSn1 to TSn4 are LRp1, LRn1, LSp1 to LSp4, and LSn1 to LSn4, respectively. In this case, the transistors TRp1, TRn1, TSp1 to TSp4, and TSn1 to TSn4 flow currents proportional to WRp1/LRp1, WRn1/LRn1, WSp1/LSp1 to WSp4/LSp4, and WSn1/LSn1 to WSn4/LSn4, respectively. That is, a ratio of reference currents Iref1 and Iref2 and supply current I1 to I4 is defined by a ratio of the sizes (WRp1/LRp1, WRn1/LRn1, WRp2/LRp2, WRn2/LRn2, WSp1/LSp1 to WSp4/LSp4, and WSn1/LSn1 to WSn4/LSn4) of the transistors included in the reference current paths PR1 and PR2 and the supply current paths PS1 to PS4, respectively. For example, WRp1/LRp1:WSp1/LSp1=Iref1:I1,
WRp1/LRp1:WSp2/LSp2=Iref1:I2,
WRp2/LRp2:WSp3/LSp3=Iref2:I3, and
WRp2/LRp2:WSp4/LSp4=Iref2:I4.

It is preferable that WRp1/LRp1 be equal to WRn1/LRn1. It is also preferable that WSp1/LSp1 to WSp4/LSp4 be equal to WSn1/LSn4 to WSn4/LSn4, respectively.

With this configuration, the reference current paths PR1 and PR2 flow the reference currents Iref1 and Iref2 from the internal step-down power supply VAA to the current generation circuit 12, respectively. The supply current paths PS1 to PS4 flow the supply currents I1 to I4, respectively, from the internal step-down power supply VAA to the bit lines BL.

For example, the supply currents I1 to I4 are designed to be k×Iref1, (k/10)×Iref1, (k/100)×Iref1, and (k/1000)×Iref1, respectively (k is a positive number). That is, the supply current paths PS1 to PS4 can flow currents k times to k/1000 times as large as the reference current Iref1, respectively, to the bit lines BL.

In this example, a plurality of the reference current paths (PR1 and PR2) are provided. This is because, if only the reference current path PR1 is used to practically switch the currents I1 to I4 flowing to the bit lines BL from k times to k/1000 times as large as the reference current Iref1, the sizes of the transistors in the reference current path PR1 or the transistors in the supply current paths PS1 to PS4 become extremely large. That is, provision of the reference current paths PR1 and PR2 enables to reduce the area of the read/write driver 10 according to the first embodiment.

For example, the reference current path PR1 corresponds to the supply current paths PS1 and PS2 and the supply currents I1 and I2 are generated based on the reference current Iref1. In this case, WSp1/LSp1 (WSn1/LSn1) is k times of WRp1/LRp1 (WRn1/LRn1) and WSp2/LSp2 (WSn2/LSn2) is k/10 times thereof.

The reference current path PR2 corresponds to the supply current paths PS3 and PS4 and the supply currents I3 and I4 are generated based on the reference current Iref2. When WRp2/LRp2 (WRn2/LRn2) is equal to WRp1/LRp1 (WRn1/LRn1) (that is, when Iref2 is equal to Iref1), WSp3/LSp3 (WSn3/LSn3) is k/100 times of WRp2/LRp2 (WRn2/LRn2) and WSp4/LSp4 (WSn4/LSn4) is k/1000 times thereof. Accordingly, the supply currents I3 and I4 are Iref1×k/100 and Iref1×k/1000 based on the reference current Iref2, respectively.

In this way, the read/write driver 10 according to the first embodiment can flow the currents k times to k/1000 times of the reference current Iref1 to the bit lines BL.

One of the reference current paths PR1 and PR2 can be selected by the switches SWR11 to SWR22. For example, to select the reference current path PR1 to flow the reference current Iref1, it suffices to turn the switches SWR11 and SWR12 on. To select the reference current path PR2 to flow the reference current Iref2, it suffices to turn the switches SWR21 and SWR22 on.

Any of the supply current paths PS1 to PS4 can be selected by the switches SWS11 to SWS42. For example, to select the supply current path PS1 to flow the supply current I1, it suffices to turn the switches SWS11 and SWS12 on. Similarly, to select the supply current path PS2 to flow the supply current I2, it suffices to turn the switches SWS21 and SWS22 on. To select the supply current path PS3 to flow the supply current I3, it suffices to turn the switches SWS31 and SWS32 on. To select the supply current path PS4 to flow the supply current I4, it suffices to turn the switches SWS41 and SWS42 on.

As mentioned above, the read/write driver 10 can supply a current of arbitrary times as large as the reference current Iref1 to the bit lines BL by selecting one of the reference current paths and one of the supply current paths. Accordingly, even when the characteristic of the memory cells vary, the read/write driver 10 according to the first embodiment can supply currents suitable for characteristics of the memory cells. It suffices to set one of the reference current paths and one of the supply current paths to be selected at a time when the characteristics of the memory cells are known.

For example, in the read operation or the write operation, a voltage to be applied to a selected bit line BL is set to the reference potential Vref(BL) and is input to the non-inverting input terminal of the operational amplifier AMP2. In the case of read, the reference potential Vref(BL) can be, for example, about 0.5 volt. In the case of write, the reference potential Vref(BL) can be, for example, 1.2 to 1.5 volts. The reference potential Vref(OP) having a medium value between the international step-down potential VAA and the reference potential Vref(BL) is then input to the inverting input terminal of the operational amplifier AMP1. The international step-down potential VAA can be, for example, about 4 volts. The reference potential Vref(OP) can be, for example, about 3.5 volts.

Switches in the current generation circuit 12 are then changed over to have a resistance of a value (Vref(OP)/Iref1) obtained by dividing the reference potential by the reference current. In this way, values of the reference potentials Vref(OP) and Vref(BL) and the reference current Iref1 (or Iref2) are defined.

As one specific example, the read/write driver 10 according to the first embodiment performs the read operation as follows.

For example, it is assumed that k is 4. In this case, the supply currents I1 and I2 of the supply current paths PS1 and PS2 are 4×Iref1 and 0.4×Iref1, respectively. The supply currents I3 and I4 of the supply current paths PS3 and PS4 are 0.04×Iref1 and 0.004×Iref1, respectively. The reference current paths PR1 and PR2 flow equal reference currents (Iref1=Iref2), respectively. Accordingly, the read/write driver 10 can supply the currents of 0.004×Iref1 to 4×Iref1 to the bit lines BL by changing over the supply current paths PS1 to PS4.

When the switches SWR11, SWR12, SWS21, SWS22, and SW2 are turned on as shown in FIG. 2, the reference current path PR1 and the supply current PS2 are selected. The reference current path PR1 flows the reference current Iref1 to the current generation circuit 12. Accordingly, the supply current path PS2 flows the supply current of 0.04× Iref1 to a selected bit line BL.

When selected memory cells connected to a selected bit line BL are in low-resistance states, the current flows more through the selected memory cells. Therefore, the potential of the sense node SN becomes lower than the potential Vref(OP) of the reference node RN. That is, the potential of the non-inverting input terminal of the operational amplifier AMP3 serving as a sense amplifier becomes lower than that of the inverting input terminal thereof. Accordingly, the sense amplifier AMP3 outputs almost 0 volt as an output voltage V(out).

On the other hand, when the selected memory cells connected to a selected bit line BL are in high-resistance states, the current flows little through the selected memory cells. Therefore, the potential of the sense node SN increases toward the internal step-down potential VAA to become higher than the potential Vref(OP) of the reference node RN. That is, the potential of the non-inverting input terminal of the sense amplifier AMP3 becomes higher than that of the inverting input terminal thereof. Accordingly, the sense amplifier AMP3 outputs almost VAA as the output voltage V(out). In this way, the read/write driver 10 according to the first embodiment can read data of the memory cells.

While the bit lines BL have large capacities, the bit lines BL are disconnected from the sense node SN (the non-inverting input terminal of the sense amplifier AMP3) by a clamp transistor (not shown). Therefore, the read/write driver 10 can rapidly read the data.

In the write operation, the read/write driver 10 performs the same operation as the read operation in supplying an arbitrary current to a selected bit line BL. The read/write deriver 10 can write (for example, set or reset) data to selected memory cells by flowing a relatively large current to the memory cells. However, in the write operation, it is unnecessary to operate the sense amplifier AMP3.

(Current Generation Circuit 12)

The current generation circuit 12 includes a ladder-binary current-addition DA (Digital/Analog) converter DAC1 and a decode DA converter DAC2. The current generation circuit 12 can control the value of the reference current Iref1 or Iref2 using the DA converters DAC1 and DAC2.

The DA converter DAC1 includes resistors R1 to R14 and switches SW10 to SW25. The resistors R10 to R14 have resistance values of, for example, R (R is a positive number), respectively. In this case, the resistors R1 to R7 have resistance values of, for example, 2R, respectively. One end of the resistor R1 is connected to the node Nref(BL) and the other end thereof is connected to a low-voltage source VSS (for example, a ground potential) via the resistors R10 to R14. One ends of the resistors R2 to R7 are connected to the node Nref(BL) via the switches SW10 to SW15 and are connected to a node Nmon via the switches SW20 to SW25, respectively. The other end of the resistor R2 is connected to the low-voltage source VSS via the resistors R10 to R14. The other end of the resistor R3 is connected to the low-voltage source VSS via the resistors R11 to R14. The other end of the resistor R4 is connected to the low-voltage source VSS via the resistors R12 to R14. The other end of the resistor R5 is connected to the low-voltage source VSS via the resistors R13 and R14. The other end of the resistor R6 is connected to the low-voltage source VSS via the resistor R14. In this way, the DA converter DCA1 is configured as the ladder-binary current-addition DA converter.

The switches SW10 and SW20 operate complementarily to each other. Similarly, pairs of the switches SW11 and SW21, the switches SW12 and SW22, the switches SW13 and SW23, the switches SW14 and SW24, and the switches SW15 and SW25 also operate complementarily to each other, respectively. The switches SW10 to SW25 change the states on or off upon reception of a digital signal, respectively. This enables the DA converter DAC1 to control a current (the reference current Iref1 or Iref2) to flow to the node Nmon.

In the DA converter DAC1, when the nodes Nref(BL) and Nmon are viewed from a point P1, the resistors R1 and R2 are connected between the point P1 and the nodes Nmon and Nref(BL), respectively. Because the operational amplifier AMP2 controls the reference potential Vref(BL) and a potential Vmon to be equal to each other, currents (for example, Id) flowing in the resistors R1 and R2 are equal to each other. That is, when viewed from the point P1, it is seen that two resistors having values of 2×R are connected in parallel to the potential Vmon and the reference potential Vref(BL), respectively. Accordingly, the current Id from the resistor R1 and the current Id from the resistor R2 converge at the point P1, whereby a current 2×Id flows toward the low-voltage source VSS.

When the nodes Nref(BL) and Nmon are viewed from a point P2, it is similarly seen that two resistors having values of 2×R are connected in parallel to the potential Vmon and the reference potential Vref(BL), respectively. Accordingly, the current 2×Id from the point P1 and a current 2×Id from the resistor R3 converge at the point P2, whereby a current 4×Id flows toward the low-voltage source VSS.

When the nodes Nref(BL) and Nmon are viewed from a point P3, it is similarly seen that two resistors having values of 2×R are connected in parallel to the potential Vmon and the reference potential Vref(BL), respectively. Accordingly, the current 4×Id from the point P2 and a current 4×Id from the resistor R4 converge at the point P3, whereby a current 8×Id flows toward the low-voltage source VSS.

When the nodes Nref(BL) and Nmon are viewed from a point P4, it is similarly seen that two resistors having values of 2×R are connected in parallel to the potential Vmon and the reference potential Vref(BL), respectively. Accordingly, the current 8×Id from the point P3 and a current 8×Id froth the resistor R5 converge at the point P4, whereby a current 16×Id flows toward the low-voltage source VSS.

This is repeated and accordingly a current 64×Id flows to the low-voltage source VSS at the point P6. When the number of resistor ladders is m (m is an integer), a current flowing to the DA converter DAC1 is $2^m \times Id$. A combined resistance of the DA converter DAC1 is R.

The current (Iref1 or Iref2) flowing toward the node Nmon is changed by changing over the binary switches SW10 to SW25. For example, when the switches SW20, SW21, SW23, and SW25 are turned on and the switches SW22 and SW24 are turned off, the DA converter DAC1 flows a current of the sum of the currents flowing through the resistors R2, R3, R5, and R7 (Id+2Id+8Id+32Id=43×Id). By changing over the switches SW10 to SW25, the current flowed by the DA converter DAC1 to the node Nmon can be controlled.

The DA converter DAC2 includes resistors R30 to R32 and switches SW30 to SW32. The resistors R30 to R32 have resistance values of, for example, R (R is a positive number), respectively. One ends of the resistors R30 to R32 are connected to the node Nmon via the switches SW30 to SW32, respectively, and the other ends thereof are connected to the low-voltage source VSS. In this way, the DA converter DAC2 is configured as a decoder DA converter.

The resistors R30 to R32 are connected in parallel to the DA converter DAC1 and thus each can flow a current equal to that of the DA converter DAC1. For example, when the DA converter DAC1 flows the current of 64×Id in total, each of the resistors R30 to R32 can flow the current of 64×Id.

For example, when the switch SW30 is on and the switches SW31 and SW32 are off as shown in FIG. 2, the resistor R30 flows the current of 64×Id from the node Nmon to the low-voltage source VSS. Therefore, in the state shown in FIG. 2, the DA converter DAC1 flows the current of 43×Id and the DA converter DAC2 flows the current of 64×Id. That is, the value of the reference current Iref1 or Iref2 is 107×Id.

Because the DA converter DAC1 is a binary ladder circuit, it has a smaller layout area than that of the decoder DA converter DAC2. Meanwhile, the decoder DA converter DAC2 is less likely to generate noise than the DA converter DAC1 when the switches are changed over. For example, because the binary DA converter DAC1 has a higher element sensitivity corresponding to an MSB (Most Significant Bit), noise at the time when switches for high-order addresses are changed over increases. However, the decoder DA converter DAC2 does not have such a problem.

Therefore, by providing the binary DA converter DAC1 and the decoder DA converter DAC2, advantages of the both DA converters are achieved. That is, a current not corresponding to the MSB is supplied by the binary DA converter DAC1 and a current corresponding to the MSB is supplied by the decoder DA converter DAC2. In this way, the current generation circuit 12 flows the reference current Iref1 or Iref2 via the node Nmon.

The reference current Iref1 or Iref2 and the potential Vmon are defined by the setting of the reference potential Vref(BL) and the switches SW10 to SW32.

(iPCM)

The read/write driver 10 according to the first embodiment is applicable to, for example, an iPCM. The iPCM is a memory that stores therein data "1" or "0" by phase transition of memory elements between two states of a high-resistance state and a low-resistance state. Of course, the first embodiment is also applicable to current-detection memories such as a ReRAM, a PRAM, a PCM, a FeNAND, or an MRAM, as well as to the iPCM.

Figure 3:
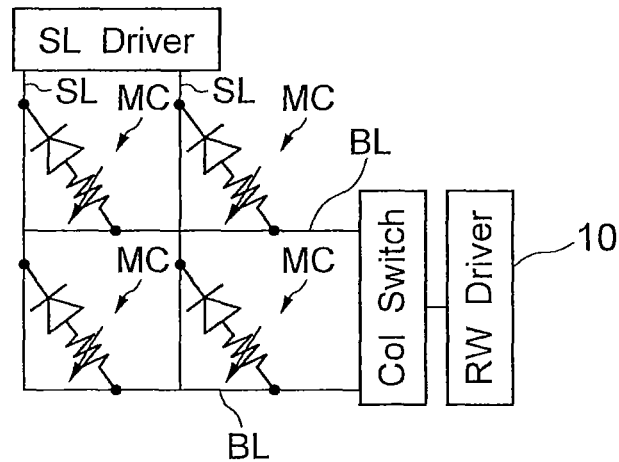
FIG. 3 shows an example of memory cells of an iPCM, each memory cell including a diode as a selecting element.

FIG. 3 shows an example of memory cells of an iPCM, each memory cell including a diode as a selecting element. Each of the memory cells MC includes a memory element and a diode connected in series between one of the bit lines LB and one of source lines SL. The diode is connected to flow a current from the relevant bit line BL to the relevant source line SL. The source lines SL are connected to a source line driver and the bit lines BL are connected to the read/write driver 10 via a column switch. The source line driver selectively connects any of the source lines SL to VSS or a positive voltage. The column switch selectively connects any of the bit lines BL to the read/write driver 10.

For example, the read/write driver 10 sets the potential of one of the bit lines BL connected to a memory cell MC selected during read or write to 3 volts and the source line driver sets the potential of one of the source lines SL connected to the selected memory cell MC to 0 volt. This applies a forward bias to the diode of the selected memory cell MC and enables a current from the read/write driver 10 to flow to the selected memory cell MC. At that time, it suffices to set non-selected bit lines BL to 0 volt and non-selected source lines SL to 3 volts. This prevents potential differences from occurring among non-selected memory cells MC. Alternatively, a reverse bias is applied to the diodes of the non-selected memory cells MC and thus no current flows in the non-selected memory cells MC.

Figure 4:
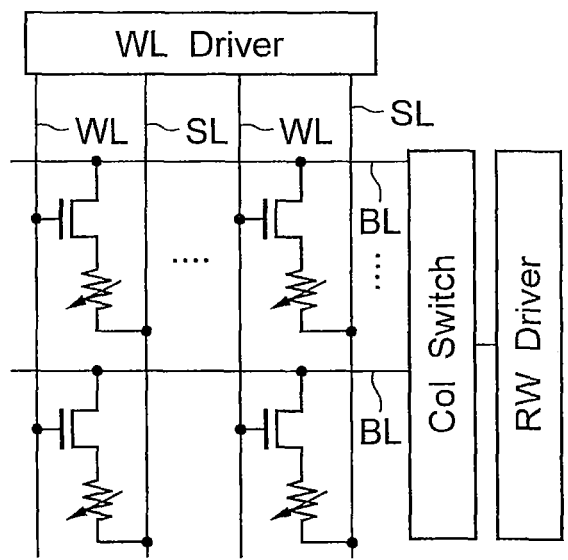
FIG. 4 shows an example of memory cells of an iPCM, each memory cell including a transistor as a selecting element.

FIG. 4 shows an example of memory cells of an iPCM, each memory cell including a transistor as a selecting element. Each of the memory cells MC includes a memory element and a transistor connected in series between one of bit lines BL and one of source lines SL. A gate of each of the transistors is connected to one of word lines WL. The word lines WL are connected to a word line driver and the bit lines BL are connected to the read/write driver 10 via a column switch. The source lines SL are connected to the low-voltage source VSS.

With this configuration, at the time of reading or writing, the read/write driver 10 can flow a current to a memory cell MC selected by one of the word lines WL and one of the bit lines BL.

While a specific example in which the read/write driver 10 according to the first embodiment is applied to the iPCM has been described above, the read/write driver 10 is applicable to arbitrary current-detection memories, as well as to the iPCM.

The reference node RN is set to the reference potential Vref(OP), which is the reference potential of the sense amplifier AMP3 to be used for data detection and is a medium potential between the internal step-down potential VAA and the reference potential Vref(BL). In the first embodiment, it is accordingly unnecessary to generate different reference potentials to be used for data detection. Furthermore, the read/write driver 10 according to the first embodiment can arbitrarily define the reference current Iref1 or Iref2 through setting of the switches SW10 to SW32 in the current generation circuit 12. The read/write driver 10 can supply various currents to the bit lines BL based on the reference current Iref1 or Iref2 through selection of the reference current paths and the supply current paths. This enables the read/write driver 10 according to the first embodiment to supply currents suitable for characteristics of memory cells even when the characteristics of the memory cells vary.

Second Embodiment

Figure 5:
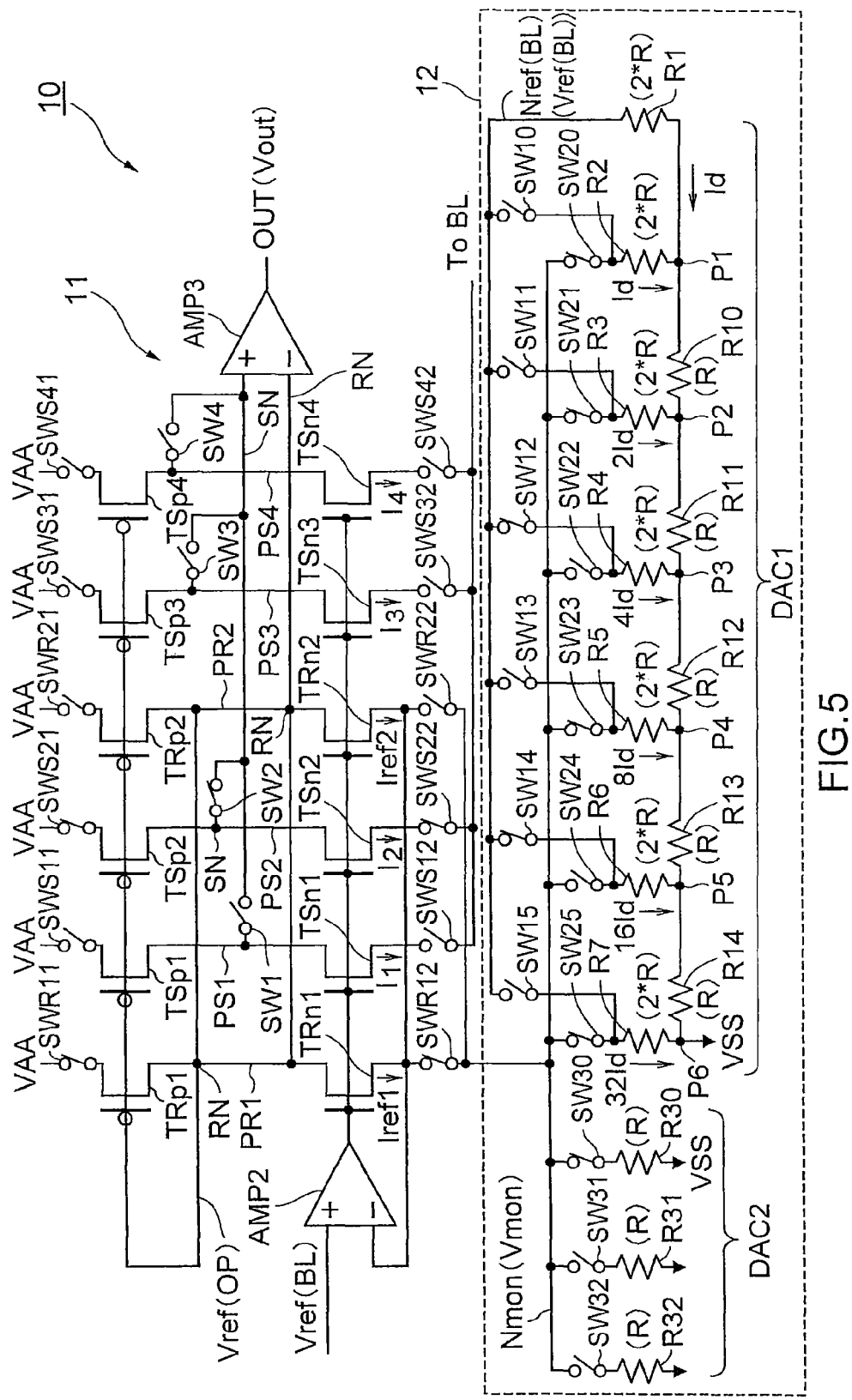
FIG. 5 is a circuit diagram showing an example of a configuration of the read/write driver 10 according to a second embodiment.

FIG. 5 is a circuit diagram showing an example of a configuration of the read/write driver 10 according to a second embodiment. In the second embodiment, the reference node RN is directly connected to the gates of the P transistors TRp1, TRp2, and TSp1 to TSp4. That is, the P transistors TRp1 and TRp2 are diode-connected between the power supply VAA and the reference node RN. Other configurations of the second embodiment can be identical to corresponding configurations of the first embodiment. Therefore, the second embodiment has effects identical to those of the first embodiment. Furthermore, in the second embodiment, the operational amplifier AMP1 is omitted to reduce a feedback loop. Accordingly, operations of the read/write driver 10 according to the second embodiment are more stabilized.

The reference potential Vref(OP) is a potential reduced from the power supply potential VAA by a voltage drop in the diode-connected P transistor TRp1 or TRp2. Therefore, the reference potential Vref(OP) according to the second embodiment can also be the reference potential of the sense amplifier AMP3 to be used for data detection and a medium potential between the power supply potential VAA and the reference potential Vref(BL).

Third Embodiment

Figure 6:
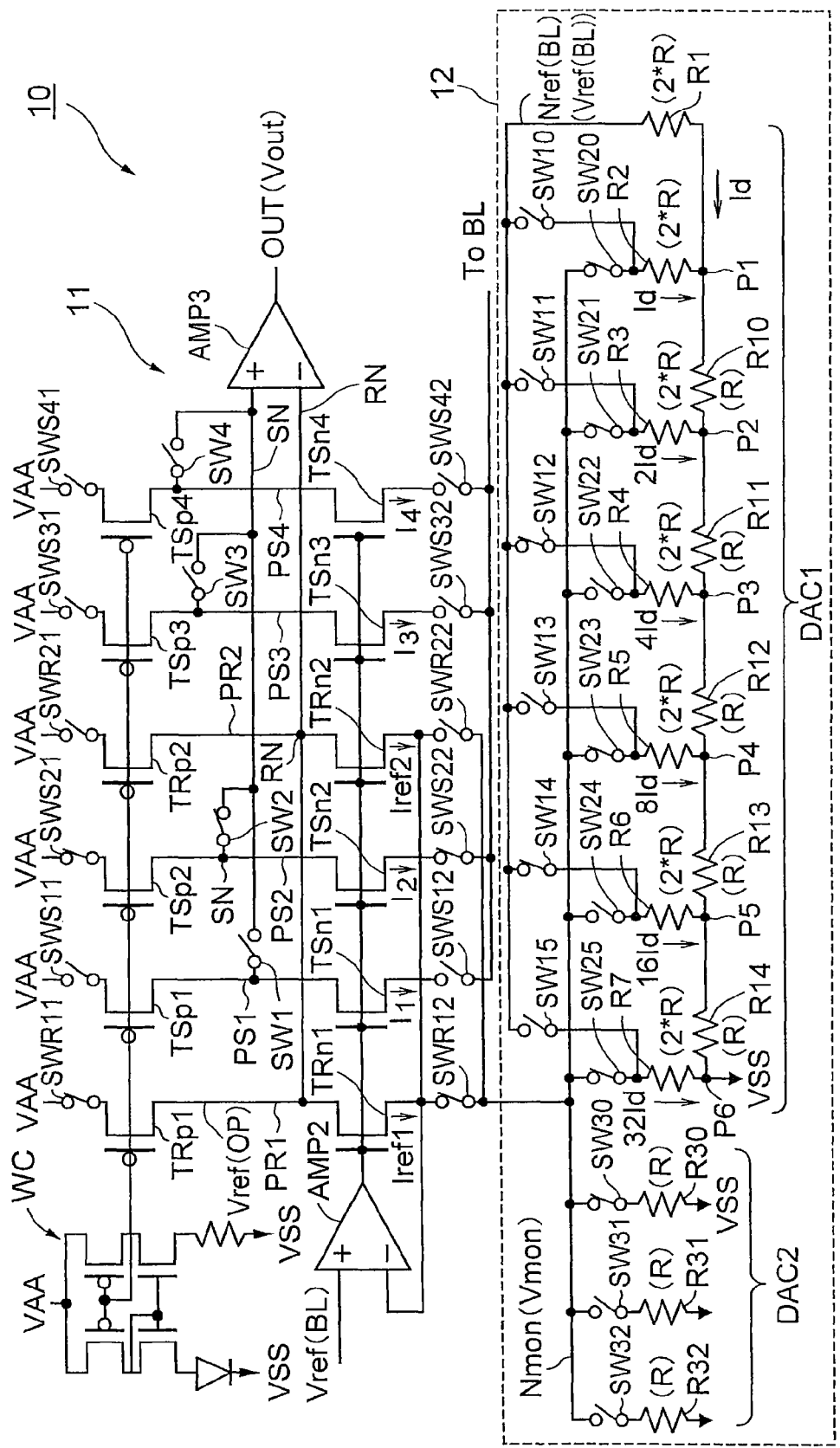
FIG. 6 is a circuit diagram showing an example of a configuration of the read/write driver 10 according to a third embodiment.

FIG. 6 is a circuit diagram showing an example of a configuration of the read/write driver 10 according to a third embodiment. In the third embodiment, the gates of the P transistors TRp1, TRp2, and TSp1 to TSp4 are connected to a Wilson constant current circuit WC. The Wilson constant current circuit WC is connected between the power supply VAA and the low-voltage source VSS and can generate the reference potential Vref(OP) as the reference potential of the sense amplifier AMP3 to be used for data detection and a medium potential between the power supply potential VAA and the reference potential Vref(BL). Other configurations of the third embodiment can be identical to corresponding configurations of the first embodiment. Therefore, the third embodiment has effects identical to those of the first embodiment. Furthermore, in the third embodiment, the operational amplifier AMP1 is omitted to reduce a feedback loop. Accordingly, operations of the read/write driver 10 according to the third embodiment are more stabilized.

Fourth Embodiment

Figure 7:
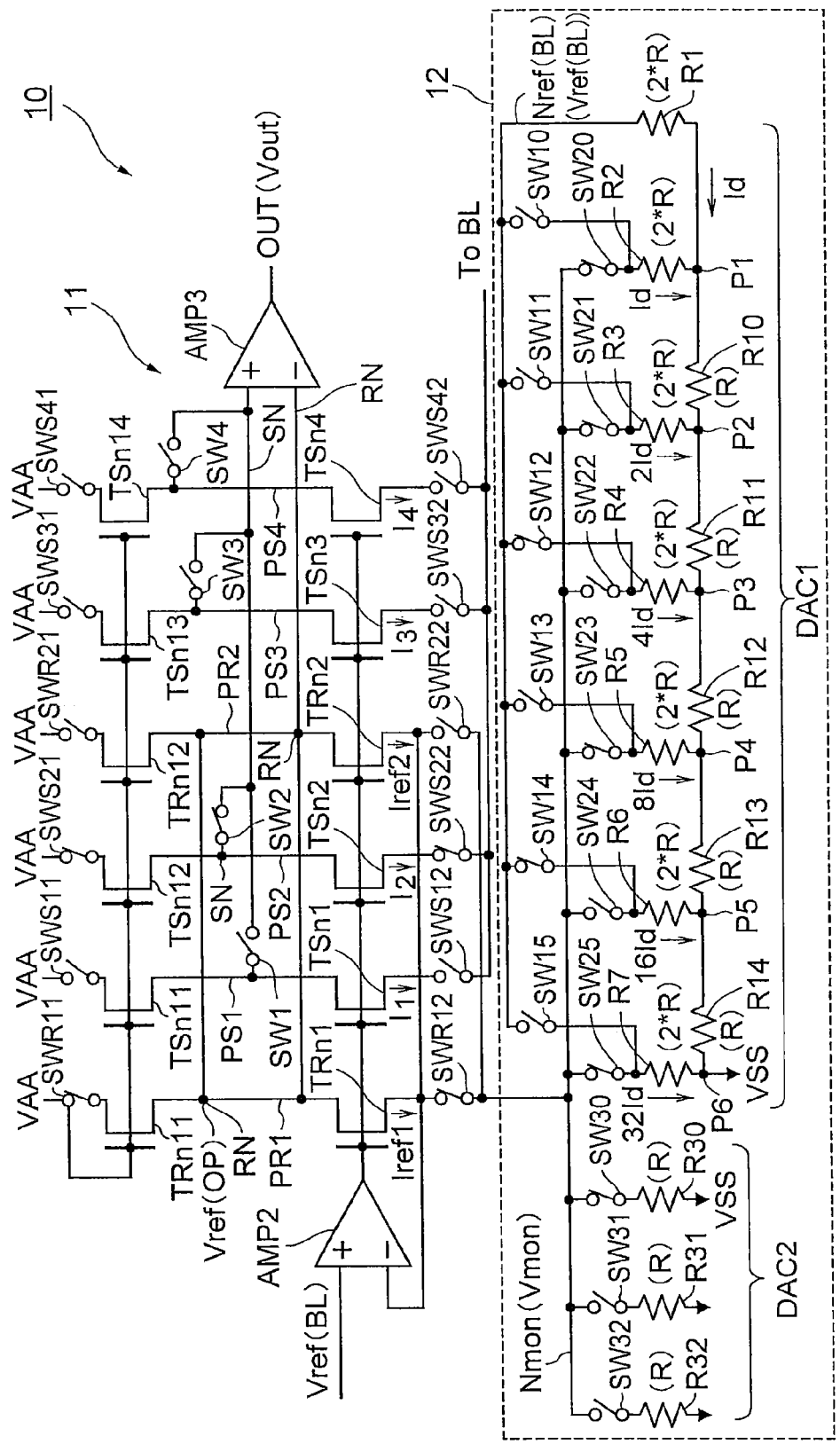
FIG. 7 is a circuit diagram showing an example of a configuration of the read/write driver 10 according to a fourth embodiment.

FIG. 7 is a circuit diagram showing an example of a configuration of the read/write driver 10 according to a fourth embodiment. In the fourth embodiment, the P transistors TRp1, TRp2, and TSp1 to TSp4 are replaced by N transistors TRn11, TRn12, and TSn11 to TSn14, respectively. Gates of the N transistors TRn11, TRn12, and TSn11 to TSn14 are connected to the power supply VAA in common. That is, the N transistors TRn11, TRn12, and TSn11 to TSn14 are diode-connected between the power supply VAA and the reference node RN. Other configurations of the fourth embodiment can be identical to corresponding configurations of the first embodiment. Therefore, the fourth embodiment has effects identical to those of the first embodiment. Furthermore, in the fourth embodiment, the operational amplifier AMP1 is omitted to reduce a feedback loop. Accordingly, operations of the read/write driver 10 according to the fourth embodiment are more stabilized.

The reference potential Vref(OP) is a potential reduced from the power supply potential VAA by a voltage drop in the diode-connected N transistor TRn11 or TRn12.

Fifth Embodiment

Figure 8:
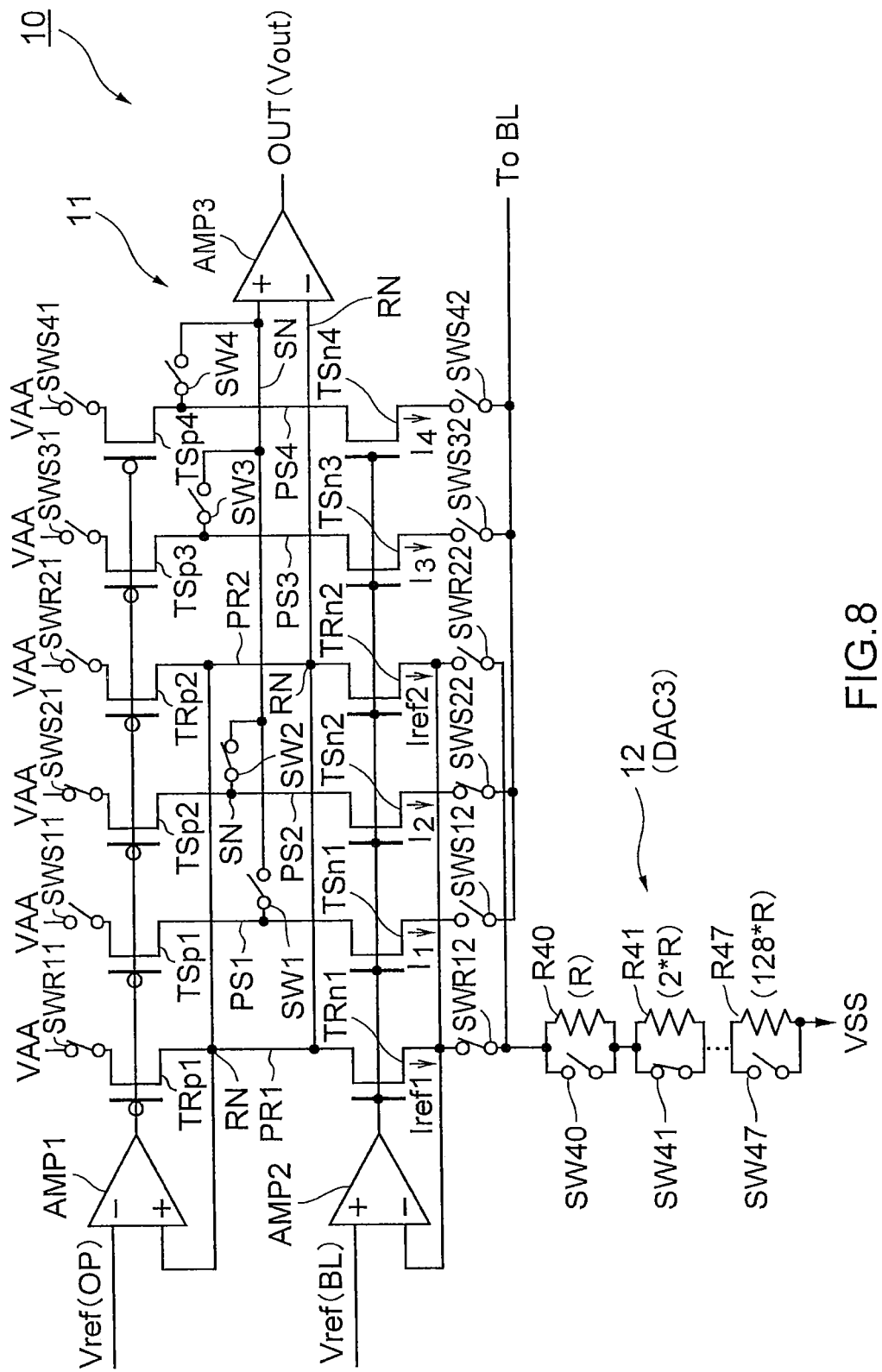
FIG. 8 is a circuit diagram showing an example of a configuration of the read/write driver 10 according to a fifth embodiment.

FIG. 8 is a circuit diagram showing an example of a configuration of the read/write driver 10 according to a fifth embodiment. In the fifth embodiment, the current generation circuit 12 is configured with a voltage-addition DA converter DAC3. The voltage-addition DA converter DAC3 includes resistors R40 to R47 and switches SW40 to SW47. The resistors R40 to R47 are connected in series between the current supply circuit 11 and the low-voltage source VSS and have resistances $R$, $2 \times R$, $2^2 \times R$ . . . and $2^7 \times R$, respectively. The switches SW40 to SW47 are connected in parallel to the resistors R40 to R47 and are provided to select the resistors R40 to R47, respectively. For example, when the resistor R40 is to be selectively connected in series between the current supply circuit 11 and the low-voltage source VSS, the switch SW40 is turned off. This causes a current to flow through the resistor R40. Similarly, when any of the resistors R41 to R47 is to be selectively connected in series between the current supply circuit 11 and the low-voltage source VSS, the corresponding one of the switches SW41 to SW47 is turned off. This causes a current to flow through the selected one of the resistors R41 to R47. When the switches SW40 to SW47 are turned on, the corresponding resistors R40 to R47 are brought to non-selected states, respectively. This is because the switches SW40 to SW47 flow a current with low resistances when the switches SW40 to SW47 are on. By changing resistors to be connected between the current supply circuit 11 and the low-voltage source VSS, the current generation circuit 12 can have a resistance value selected from $R$, $2 \times R$, $2^2 \times R$, $2^3 \times R$, . . . and $2^7 \times R$.

In the fifth embodiment, the potential applied to a selected bit line BL is set by the reference potential Vref(BL) of the operational amplifier AMP2. The supply current applied to the selected bit line BL is set by changing over the switches SW40 to S47 of the DA converter DAC3. For example, when the switch SW41 is turned off to select only the resistor R41, the supply current to the selected bit line BL has a value of Vref(BL)/2R.

In this way, the current generation circuit 12 can arbitrarily set the resistance value of the DA converter DAC3 and thus can arbitrarily set the reference current Iref1 or Iref2. Therefore, the fifth embodiment can achieve effects identical to those of the first embodiment.

Furthermore, the fifth embodiment can be combined with any one of the second to fourth embodiments. With this combination, the fifth embodiment can achieve effects identical to those any one of the second to fourth embodiments.

Sixth Embodiment

Figure 9:
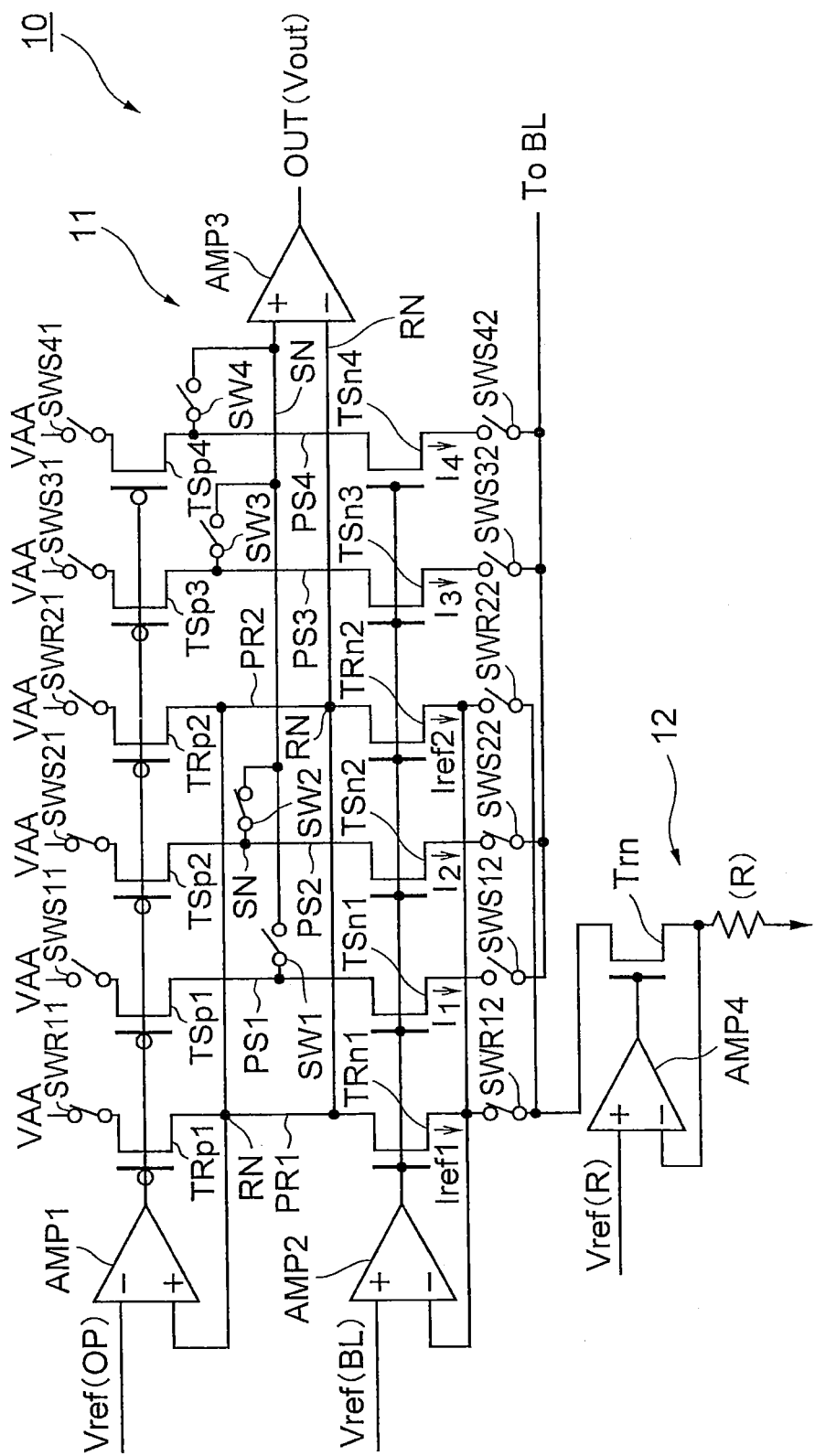
FIG. 9 is a circuit diagram showing an example of a configuration of the read/write driver 10 according to a sixth embodiment.

FIG. 9 is a circuit diagram showing an example of a configuration of the read/write driver 10 according to a sixth embodiment. In the sixth embodiment, the current generation circuit 12 is configured with a feedback circuit of an operational amplifier AMP4, instead of the DA converter. An N transistor Trn and a resistor R are connected in series between the current supply circuit 11 and the low-voltage source VSS and a gate of the N transistor Trn is connected to an output of the operational amplifier AMP4. The operational amplifier AMP4 feeds back a source potential of the N transistor Trn to the inverting input terminal, thereby controlling the N transistor Trn. The current generation circuit 12 sets the reference current Iref1 or Iref2 based on a reference potential Vref(R) input to the operational amplifier AMP4. The reference current Iref1 or Iref2 is set to have a value of Vref(R)/R.

The potential applied to a selected bit line BL is set by the reference potential Vref(BL) of the operational amplifier AMP2. The current value applied to the selected bit line BL has a value obtained by multiplying the reference current Iref1 or Iref2 by a mirror ratio of a clamp transistor (not shown).

In this way, the current generation circuit 12 can arbitrarily set the reference current Iref1 or Iref2 by setting the reference potential Vref(R) and the resistance R. Accordingly, the sixth embodiment can achieve effects identical to those of the first embodiment.

Furthermore, the sixth embodiment can be combined with any one of the second to fourth embodiments. With this combination, the sixth embodiment can achieve effects identical to those of any one of the second to fourth embodiments.

Seventh Embodiment

Figure 10:
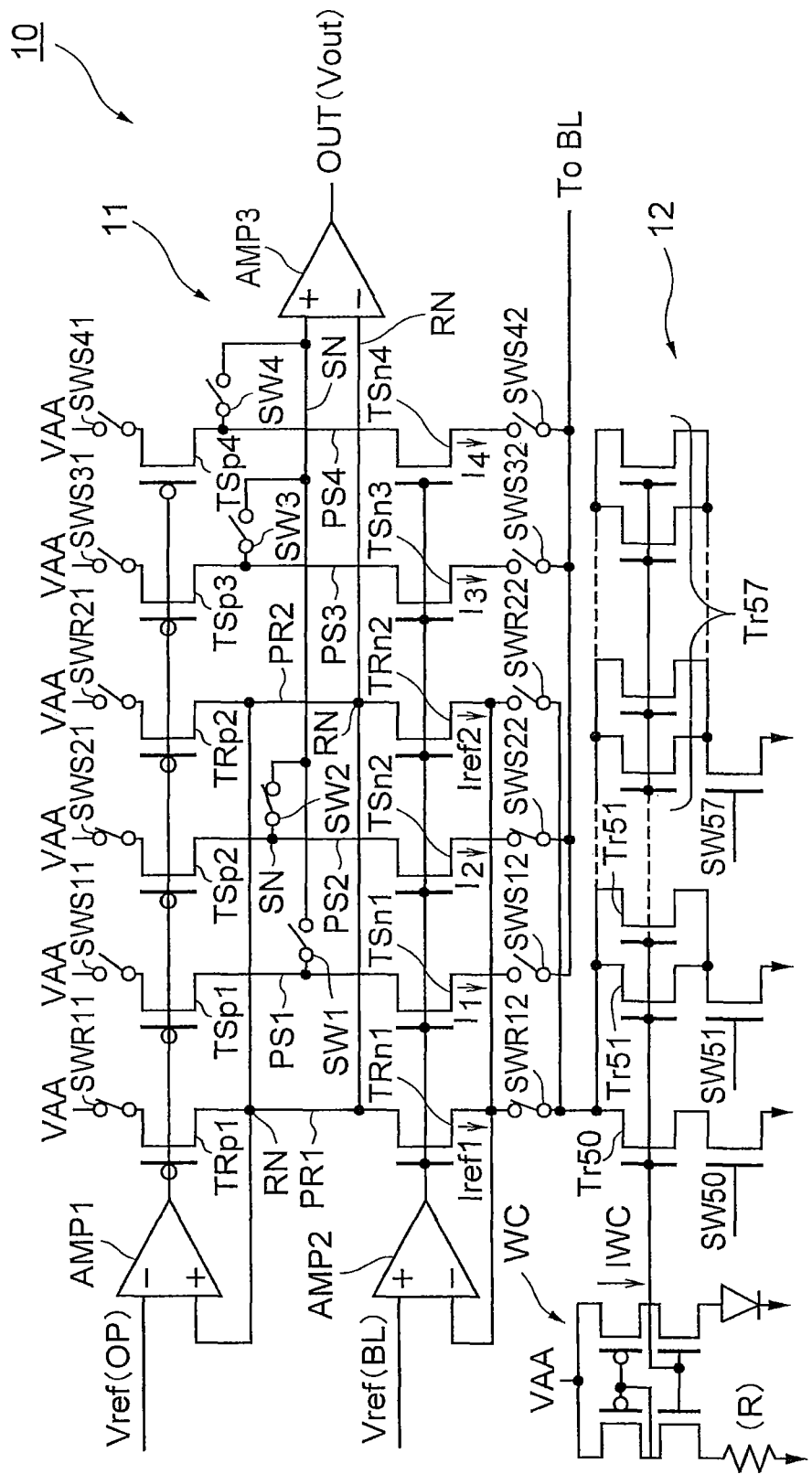
FIG. 10 is a circuit diagram showing an example of a configuration of the read/write driver 10 according to a seventh embodiment.

FIG. 10 is a circuit diagram showing an example of a configuration of the read/write driver 10 according to a seventh embodiment. In the seventh embodiment, the current generation circuit 12 is configured with a Wilson constant current circuit WC, transistors Tr50 to Tr57, and switches SW50 to SW57, instead of the DA converter. The transistor Tr50 and the switch SW50 are connected in series between the current supply circuit 11 and the low-voltage source VSS. There is one) ($2^0$) transistor Tr50 provided. The transistors Tr51 and the switch SW51 are also connected in series between the current supply circuit 11 and the low-voltage source VSS. There are two ($2^1$) transistors Tr51, which are provided to be connected in parallel to each other. The transistors Tr52 and the switch SW52 are also connected in series between the current supply circuit 11 and the low-voltage source VSS. There are four ($2^2$) transistors Tr52, which are provided to be connected in parallel to each other. Similarly, the transistors Tr53 and the switch SW53 are connected in series between the current supply circuit 11 and the low-voltage source VSS. There are $2^3$ transistors Tr53, which are provided to be connected in parallel to each other. The same holds for the transistors Tr54 to Tr57 and the switches SW54 to SW57, respectively. In this way, a plurality of current paths (current paths being configured with pairs of the transistors Tr50 to Tr57 and the switches SW50 to SW57, respectively) having different mirror ratios are formed.

When a built-in potential of a diode in the Wilson constant current circuit WC is Vbi, a current value Vbi/R (hereinafter, Iwc) flows through the Wilson constant current circuit WC.

The potential Vbi of the Wilson constant current circuit WC is applied to gates of the transistors Tr50 to Tr57 and currents obtained by multiplication of the mirror ratios of the transistors Tr50 to Tr57 flow to the transistors Tr50 to Tr57, respectively. For example, it is assumed that the transistor Tr50 flows a current of Iwc. In this case, the transistors Tr51 flow a current of 2×Iwc. The transistors Tr52 flow a current of 4×Iwc. Similarly, the transistors Tr53 to Tr57 flow currents of $2^3$×Iwc to $2^7$×Iwc, respectively.

By selection of the switch SWR12 or SWR22, the reference current Iref1 or Iref2 is determined. Therefore, the seventh embodiment can achieve effects identical to those of the first embodiment.

The voltage applied to a selected bit line BL is set by the reference potential Vref(BL) of the operational amplifier AMP2. The current value applied to the selected bit line BL has a value obtained by multiplying the reference current Iref1 or Iref2 by a mirror ratio of a clamp transistor (not shown).

Furthermore, the seventh embodiment can be combined with any one of the second to fourth embodiments. With this combination, the seventh embodiment can achieve effects identical to those of any one of the second to fourth embodiments.

Eighth Embodiment

Figure 11:
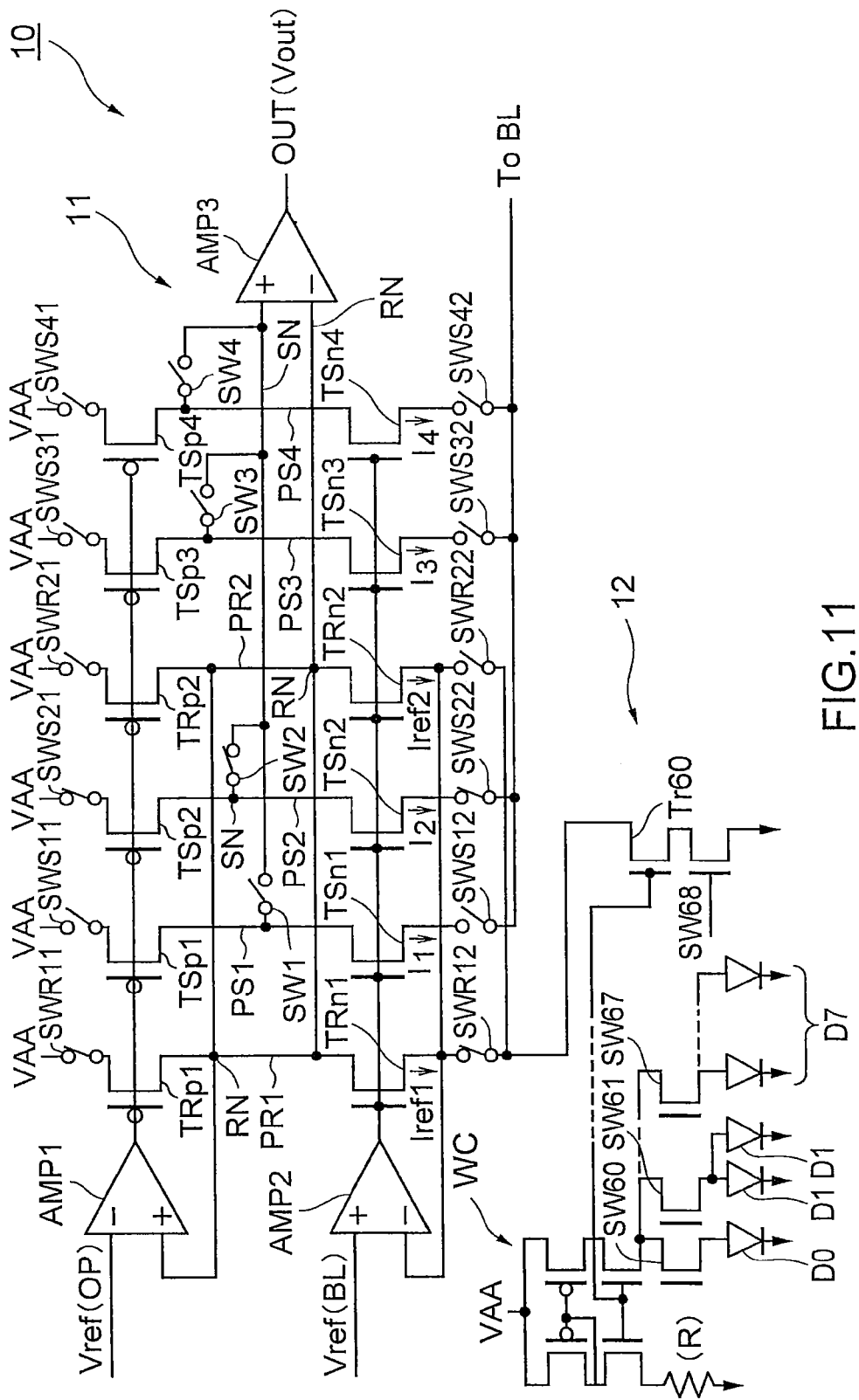
FIG. 11 is a circuit diagram showing an example of a configuration of the read/write driver 10 according to an eighth embodiment.

FIG. 11 is a circuit diagram showing an example of a configuration of the read/write driver 10 according to an eighth embodiment. In the eighth embodiment, the current generation circuit 12 is configured with the Wilson constant current circuit WC, a transistor Tr60, switches SW60 to SW68, and diodes D0 to D8.

In the seventh embodiment, the Wilson constant current circuit WC flows one current Iwc as a base and causes the mirror ratios of the current paths to be different from each other, thereby enabling to generate various levels of the reference current Iref1 or Iref2. On the other hand, in the eighth embodiment, the Wilson constant current circuit WC flows a plurality of currents Iwc as bases. The currents Iwc are mirrored to one current path, thereby enabling to generate various levels of the reference current Iref1 or Iref2.

The transistor Tr60 and the switch SW68 are connected in series between the current supply circuit 11 and the low-voltage source VSS to form a current path of the reference current Iref1 or Iref2.

The switch SW60 and the diode D0 are connected in series between the Wilson constant current circuit WC and the low-voltage source VSS. There is one ($2^0$) diode D0 provided. The switch SW61 and the diodes D1 are also connected in series between the Wilson constant current circuit WC and the low-voltage source VSS. There are two ($2^1$) diodes D1, which are provided to be connected in parallel to each other. The switch SW62 and the diodes D2 are also connected in series between the Wilson constant current circuit WC and the low-voltage source VSS. There are four ($2^2$) diodes D2, which are provided to be connected in parallel to each other. Similarly, the switch SW63 and the diodes D3 are connected in series between the Wilson constant current circuit WC and the low-voltage source VSS. There are $2^3$ diodes D3, which are provided to be connected in parallel to each other. The same holds for the switches SW64 to SW67 and the diodes D4 to D7, respectively. In this way, the Wilson constant current circuit WC can set the current Iwc at plural values by the setting of the switches SW60 to SW67.

The transistor Tr60 and the switch SW68 constitute a current path and mirror an arbitrary value of the current Iwc to enable to generate an arbitrary level of the reference current Iref1 or Iref2.

Furthermore, the eighth embodiment can be combined with any one of the second to fourth embodiments. With this combination, the eighth embodiment can achieve effects identical to those of any one of the second to fourth embodiments.

Ninth Embodiment

Figure 12:
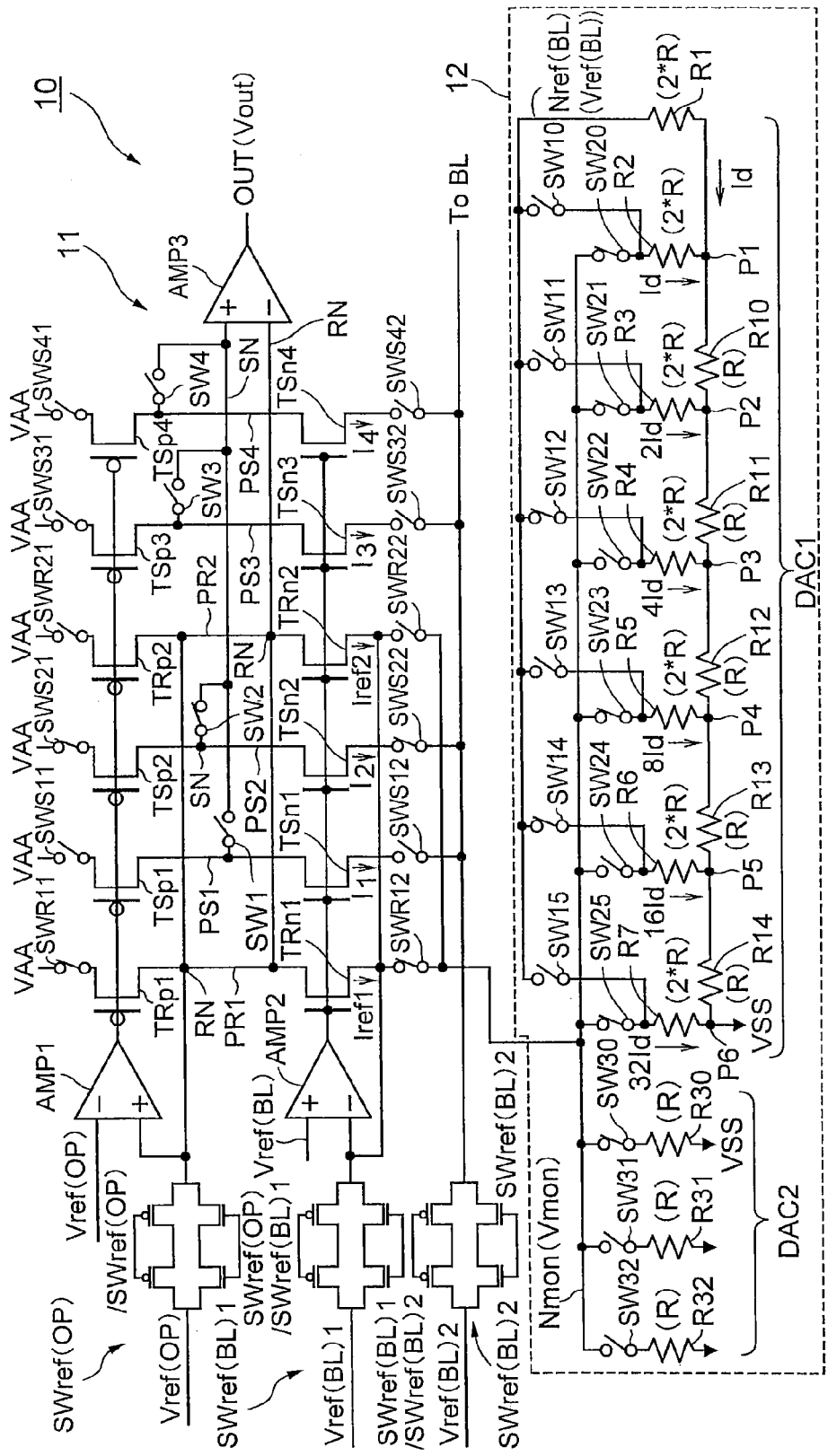
FIG. 12 is a circuit diagram showing an example of a configuration of the read/write driver 10 according to a ninth embodiment.

FIG. 12 is a circuit diagram showing an example of a configuration of the read/write driver 10 according to a ninth embodiment. The read/write driver 10 according to the ninth embodiment further includes a switch SWref(OP), a switch SWref(BL)1, and a switch SWref(BL)2. The switch SWref (OP) directly inputs the reference voltage Vref(OP) from outside to the reference node RN and to the non-inverting input terminal of the operational amplifier AMP1 in a test mode. The switch SWref(BL)1 directly inputs a voltage Vref(BL)1 from outside to the inverting input terminal of the operational amplifier AMP2 (a node between the current supply circuit 11 and the current generation circuit 12) in the test mode.

The switch SWref(BL) 2 directly inputs a voltage Vref (BL)2 from outside to a selected bit line BL in the test mode. When the switch SWref(BL)2 inputs the voltage Vref(BL)2 to the bit line BL, the operational amplifiers AMP1 and AMP2 stop the operations.

The read/write driver 10 according to the ninth embodiment can directly input the voltages Vref(OP), Vref(BL)1, and Vref(BL)2 from outside in the test mode to test the operation of the read/write driver 10, the operation of the memory, or the like.

Tenth Embodiment

Figure 13:
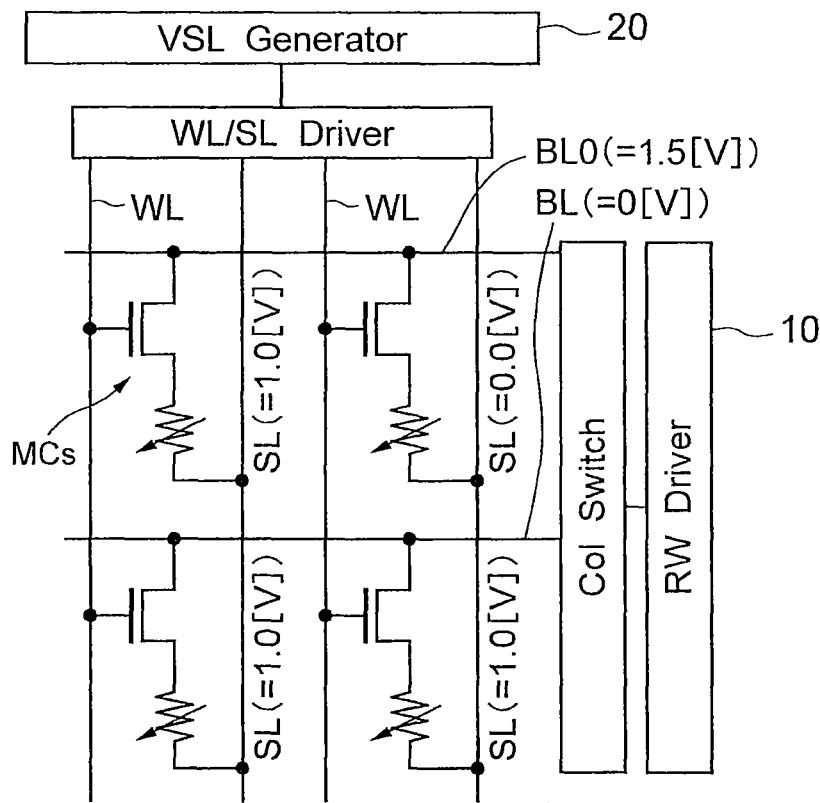
FIG. 13 is a circuit diagram showing an example of a configuration of the iPCM according to a tenth embodiment.

FIG. 13 is a circuit diagram showing an example of a configuration of the iPCM according to a tenth embodiment. The iPCM according to the tenth embodiment is different from that of other embodiments in further including a VSL generator 20. Other configurations of the tenth embodiment can be identical to corresponding configurations of other embodiments. Therefore, the read/write driver 10 can be any of those according to the first to ninth embodiments.

The VSL generator 20 increases the voltage of one of the source lines SL connected to a selected memory cell. This enables to increase the voltage of the selected bit line BL connected to the selected memory cell up to a level within an operation range of the operational amplifiers while a potential difference applied to the selected memory cell is suppressed.

For example, in the read operation, 0.5 volt is applied to a selected memory cell (iPCM element) MCs to flow a current therethrough, whereby read of data is performed. In this case, when a voltage VSL of the source line SL connected to the selected memory cell is 0 volt, the voltage of the relevant bit line BL connected to the selected memory cell needs to be lowered to 0.5 volt. The operational amplifier AMP2 in the above embodiments does not operate normally unless a threshold voltage of an N transistor included in the operation amplifier AMP2 is equal to or lower than a voltage of the selected bit line BL. That is, when the voltage of the source line SL connected to the selected memory cell is 0 volt, the threshold voltage of the N transistor included in the operational amplifier AMP2 needs to be equal to or lower than 0.5 volt.

On the other hand, for example, when the memory cell MCs in FIG. 13 is a selected memory cell in the read operation, the VSL generator 20 increases the voltage of the source line SL connected to the selected memory cell MCs to 1.0 volt. Voltages of other non-selected source lines SL are kept at 0 volt. The VSL generator 20 increases the voltage of the bit line BL connected to the selected memory cell MCs to 1.5 volts. Voltages of other non-selected bit lines BL are kept at 0 volt. This enables a potential difference applied to the selected memory cell MCs to be suppressed to 0.5 volt even when the voltage of the bit line BL is increased to 1.5 volts. Therefore, according to the tenth embodiment, it suffices that the threshold voltage of the N transistor included in the operational amplifier AMP2 is equal to or lower than 1.5 volts.

As described above, the voltage of the bit line BL connected to the selected memory cell MCs is increased while the potential difference applied to the selected memory cell MCs is suppressed. Accordingly, the transistor in the operational amplifier AMP2 of the read/write driver 10 does not need to be a transistor of a low threshold voltage and thus can be a transistor having the same threshold voltage as that of other transistors around the operational amplifier AMP2.

Eleventh Embodiment

Figure 14:
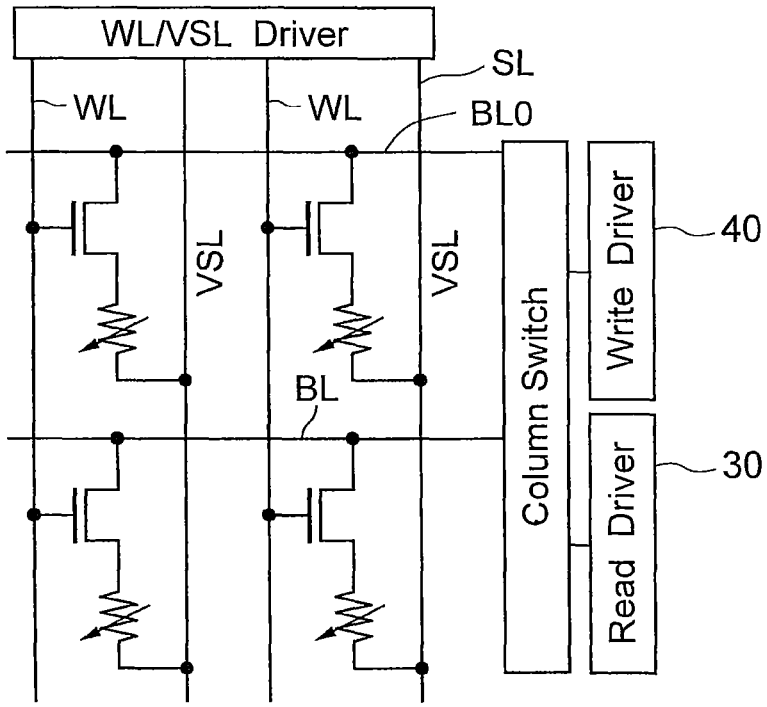
FIG. 14 is a circuit diagram showing an example of a configuration of the iPCM according to an eleventh embodiment.

FIG. 14 is a circuit diagram showing an example of a configuration of the iPCM according to an eleventh embodiment. The iPCM according to the eleventh embodiment is different from those in the above embodiments in separately including a read driver 30 and a write driver 40 instead of the read/write driver 10. Other configurations of the eleventh embodiment can be identical to corresponding configurations of other embodiments.

According to the eleventh embodiment, the read driver 30 and the write drive 40 can be separately optimized.

(Read Driver 30)

Figure 15:
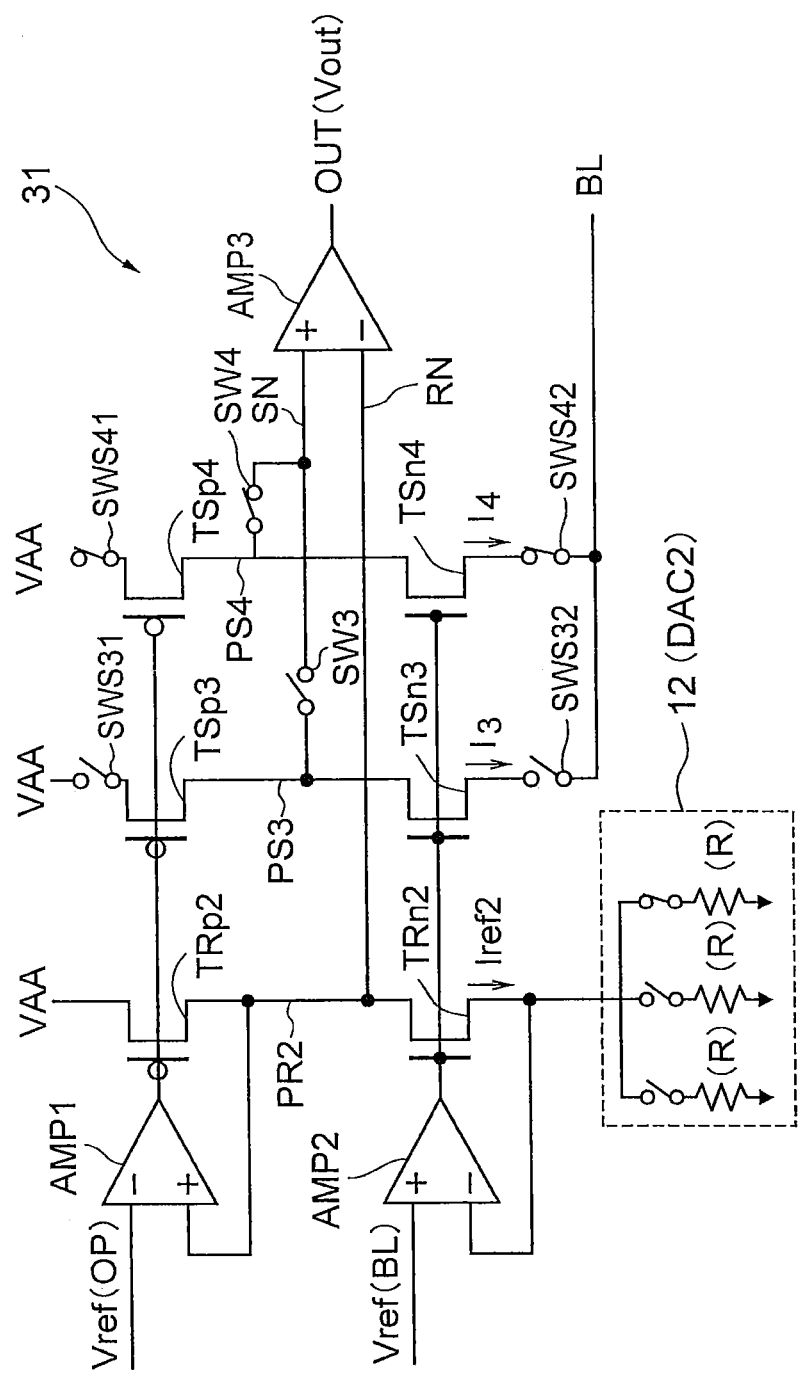
FIG. 15 is a circuit diagram showing an example of a configuration of the read driver 30.

FIG. 15 is a circuit diagram showing an example of a configuration of the read driver 30. The read driver 30 includes a current supply circuit 31 and the current generation circuit 12.

The current supply circuit 31 includes the reference current path PR2, the supply current paths PS3 and PS4, the sense amplifier AMP3, and the operational amplifiers AMP1 and AMP2. The reference current path PR2, the supply current paths PS3 and PS4, the sense amplifier AMP3, and the operational amplifiers AMP1 and AMP2 can be identical to those in the first embodiment, respectively. Because it is unnecessary to select the reference current path, the switches SWR21 and SWR22 are not provided in the reference current path PR2.

The current generation circuit 12 can be identical to the current generation circuit 12 in the first embodiment. However, because the current generation circuit 12 in the eleventh embodiment is dedicated to read, the reference current Iref2 can have a range narrower than that of the reference current Iref1 or Iref2 in the first embodiment. Therefore, the current generation circuit 12 in the eleventh embodiment can be simplified as compared to that in the first embodiment. For example, the current generation circuit 12 shown in FIG. 15 is configured with the decoder DA converter DAC2.

In this case, the reference current Iref2 in the read operation can be changed to three levels. The supply current to the bit lines BL can be changed to two levels of I3 and I4.

The read operation can be readily understood from the operation of the read/write driver 10 shown in FIG. 2, and thus explanations thereof will be omitted.

To the current generation circuit 12 and the operational amplifier AMP2 shown in FIG. 15, those in other embodiments are applicable, respectively.

Figure 16:
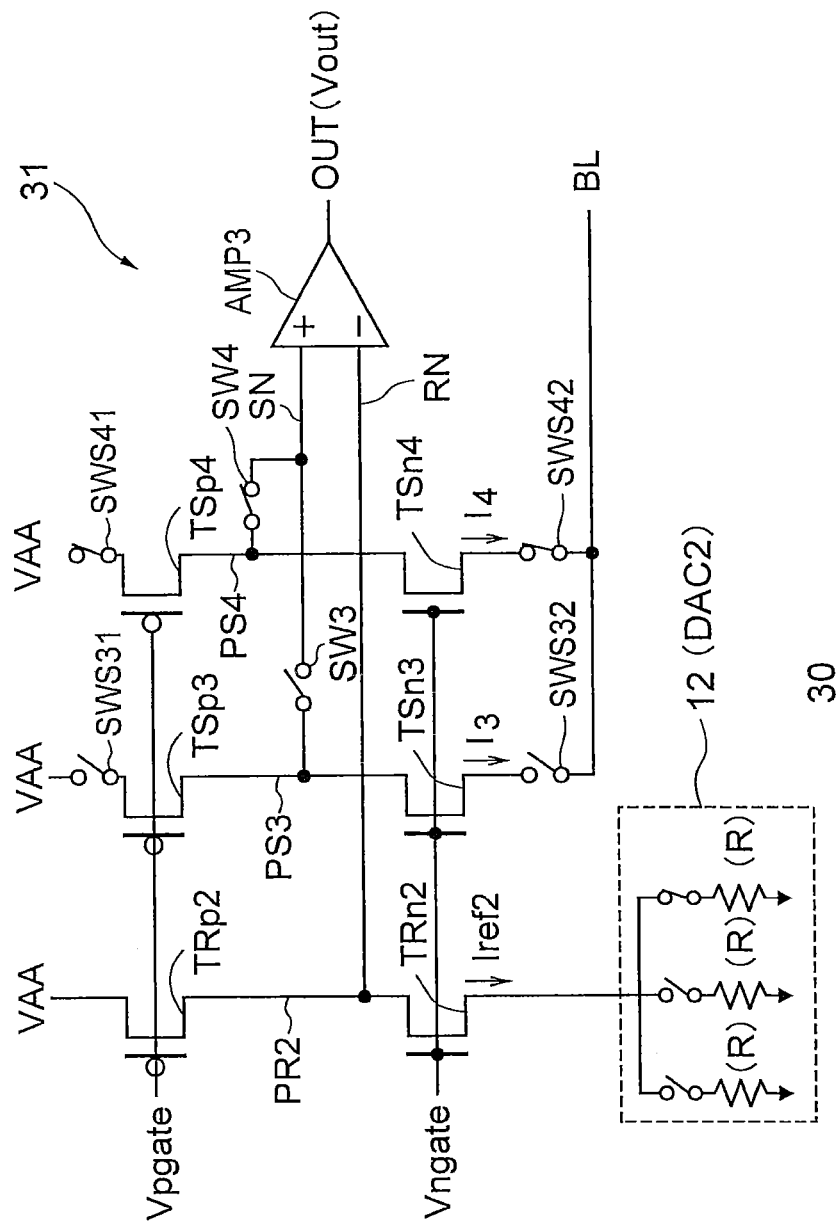
FIG. 16 is a circuit diagram showing another example of the configuration of the read driver 30.

FIG. 16 is a circuit diagram showing another example of the configuration of the read driver 30. This read driver 30 is different from that shown in FIG. 15 in not having the operational amplifiers AMP1 and AMP2 and receiving voltages Vpgate and Vngate from outside. Other configurations of the read driver 30 shown in FIG. 16 can be identical to corresponding configurations of the read driver 30 in FIG. 15.

(Write Driver 40)

Figure 17:
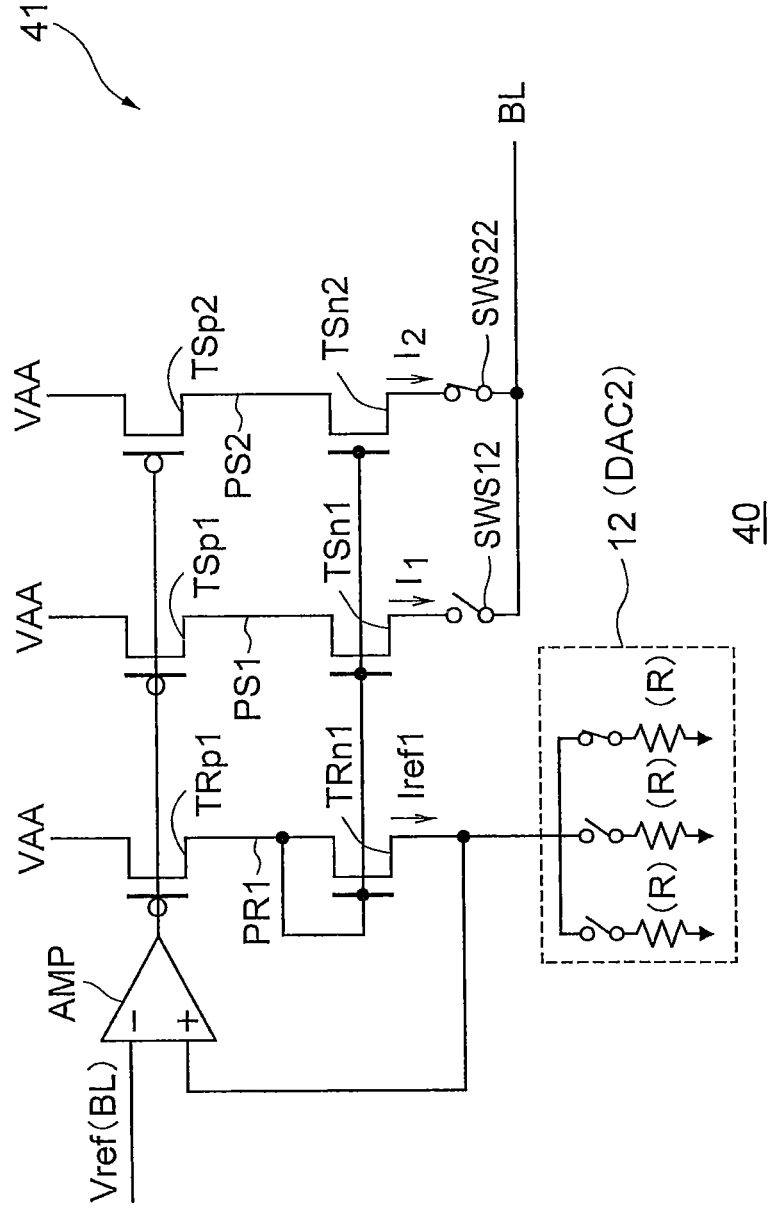
FIG. 17 is a circuit diagram showing an example of a configuration of the write driver 40.

FIG. 17 is a circuit diagram showing an example of a configuration of the write driver 40. The write driver 40 includes a current supply circuit 41 and the current generation circuit 12.

The current supply circuit 41 includes the reference current path PR1, the supply current paths PS1 and PS2, and an operational amplifier AMP. Configurations of the transistors TRp1 and TRn1 of the reference current path PR1, and the transistors TSp1, TSp2, TSn1, and TSn2 of the supply current paths PS1 and PS2 can be identical to those in the first embodiment, respectively. Because the write driver 40 does not need to detect data, the sense amplifier AMP3 for data detection is not required. As a result, the switches SW11 and SW21 of the supply current paths PS1 and PS2 are not required. Because it is unnecessary to select the reference current path PR1, the switches SWR11 and SWR12 are not provided in the reference current path PR1.

A non-inverting input of the operational amplifier AMP is connected to a node between the current supply circuit 41 and the current generation circuit 12. The N transistor TRn1 is diode-connected.

The current generation circuit 12 in the eleventh embodiment can be identical to that in the first embodiment. However, the current generation circuit 12 in the eleventh embodiment is dedicated to write, the reference current Iref1 can have a range narrower than that of the reference current Iref1 or Iref2 in the first embodiment. Therefore, the current generation circuit 12 in the eleventh embodiment can be simplified as compared to that in the first embodiment. For example, the current generation circuit 12 shown in FIG. 17 is configured with the decoder DA converter DAC2.

The operational amplifier AMP receives a feedback from the node between the current supply circuit 41 and the current generation circuit 12 and controls the P transistor TRp1 in such a manner that the voltage of the node becomes the reference voltage Vref(BL). Data write to a selected memory cell MC is performed using such a feedback circuit and flowing a current to a relevant bit line BL. At that time, there is a case where a voltage applied to write a set state as a low-resistance state and a voltage applied to write a reset state as a high-resistance state are different. Accordingly, the current generation circuit 12 is configured to change the reference current Iref1.

Figure 18:
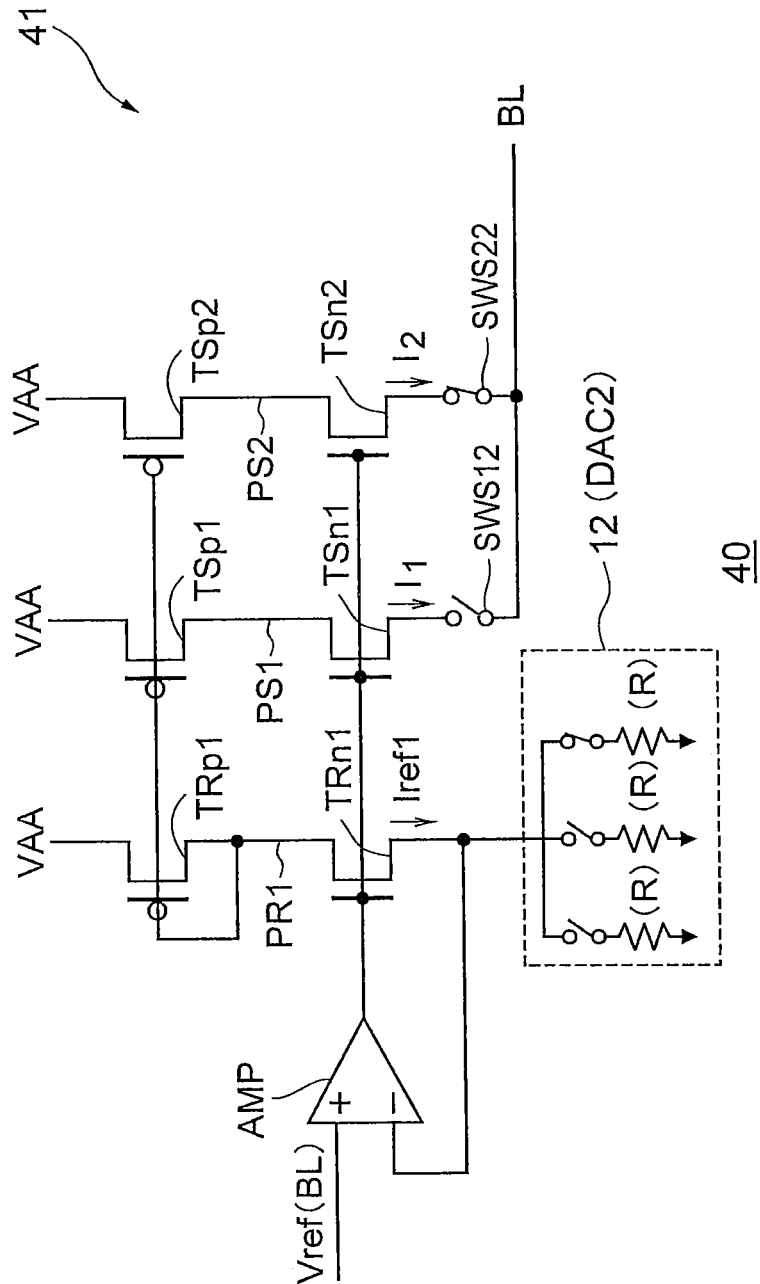
FIG. 18 is a circuit diagram showing another example of the configuration of the write driver 40.

FIG. 18 is a circuit diagram showing another example of the configuration of the write driver 40. The write driver 40 shown in FIG. 18 has the P transistor TRp1 diode-connected. The gates of the N transistors TRn1, TSn1, and TSn2 are connected to an output of the operational amplifier AMP. An inverting input of the operational amplifier AMP is connected to a node between the current supply circuit 41 and the current generation circuit 12. Other configurations of the write driver shown in FIG. 18 can be identical to corresponding configurations of the write driver 40 in FIG. 17.

In the write driver 40 shown in FIG. 18, the operational amplifier AMP receives a feedback from the node between the current supply circuit 41 and the current generation circuit 12 and controls the N transistor TRn1 in such a manner that the voltage of the node becomes the reference voltage Vref(BL). Data write to a selected memory cell MC is performed using such a feedback circuit and flowing a current to a relevant bit line BL. At that time, there is a case where a voltage applied to write a set state as a low-resistance state and a voltage applied to write a reset state as a high-resistance state are different. Accordingly, the current generation circuit 12 is configured to change the reference current Iref1.

Figure 19:
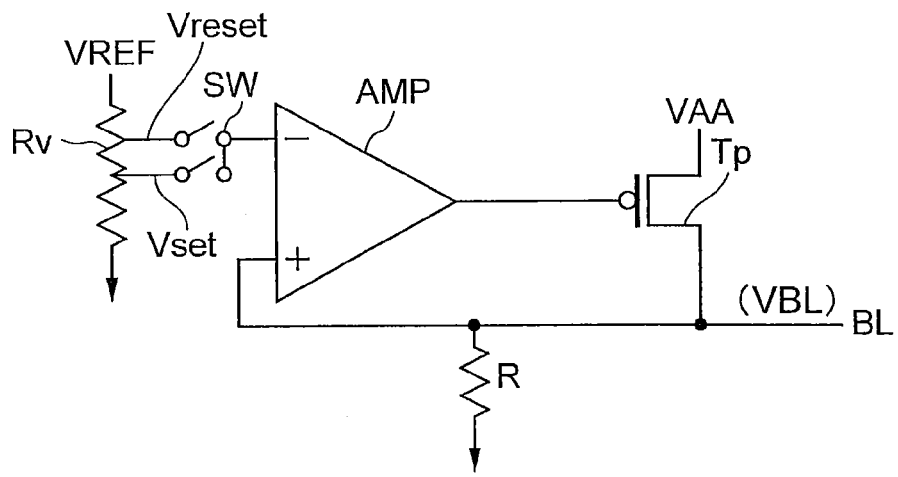
FIG. 19 is a circuit diagram showing another example of the configuration of the write driver 40.

FIG. 19 is a circuit diagram showing another example of the configuration of the write driver 40. The write driver 40 shown in FIG. 19 includes an operational amplifier AMP, a P transistor Tp, a resistor R, a switch SW, and a variable resistor Rv.

The P transistor Tp is connected between the power supply VAA and a non-inverting input of the operational amplifier AMP. A gate of the P transistor Tp is connected to an output of the operational amplifier AMP.

The non-inverting input of the operational amplifier AMP is connected to the bit lines BL and is connected to the low-voltage source VSS via the resistor R. An inverting input of the operational amplifier AMP is connected to the variable resistor Rv via the switch SW. The variable resistor Rv generates a reset voltage Vreset and a set voltage Vset from a voltage VREF. The switch SW changes a voltage applied to the inverting input of the operational amplifier AMP to the reset voltage Vreset or the set voltage Vset.

At the time of writing the set state, the operational amplifier AMP applies the set voltage Vset to the transistor Tp and the transistor Tp flows a current corresponding to the set voltage Vset to write the set state to a relevant bit line BL.

At the time of writing the reset state, the operational amplifier AMP applies the reset voltage Vreset to the transistor Tp and the transistor Tp flows a current corresponding to the reset voltage Vreset to write the reset state to a relevant bit line BL.

In this way, the write driver 40 can write the set state or the reset state to one of the memory cells in the iPCM.

Figure 20:
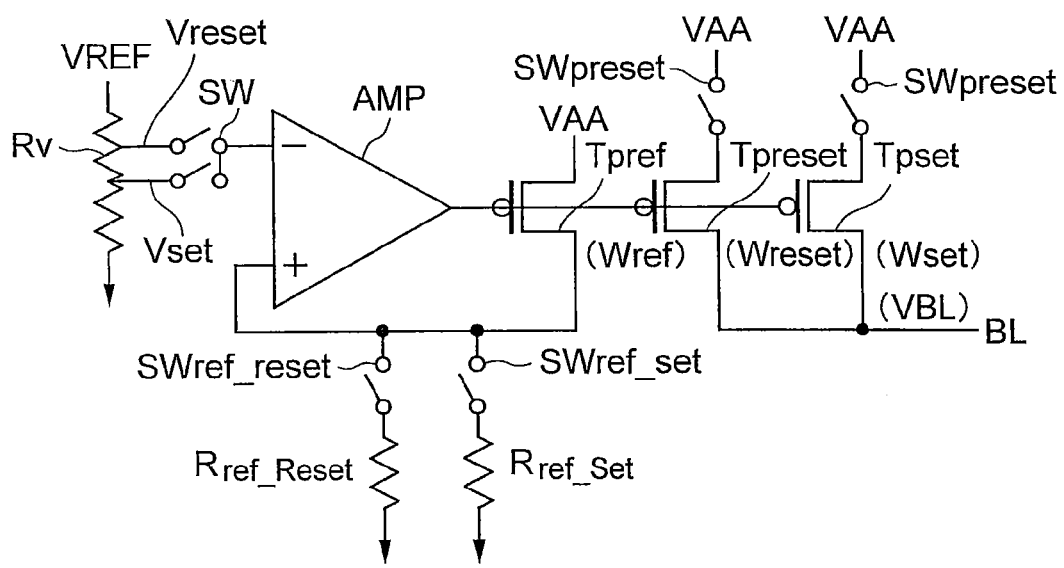
FIG. 20 is a circuit diagram showing another example of the configuration of the write driver 40.

FIG. 20 is a circuit diagram showing another example of the configuration of the write driver 40. The write driver 40 shown in FIG. 20 includes an operational amplifier AMP, P transistors Tpref, Tpreset, and Tpset, resistors Rref_reset, and Rref_set, switches SW, SWpreset, SWpset, SWref_reset, and SWref_set, and a variable resistor Rv.

The P transistor Tpref is connected between the power supply VAA and a non-inverting input of the operational amplifier AMP. A gate of the transistor Tpref is connected to an output of the operational amplifier AMP.

The non-inverting input of the operational amplifier AMP is connected to the low-voltage source VSS via a pair of the switch SWref_reset and the resistor Rref_reset and a pair of the switch SWref_set and the resistor Rref_set. An inverting input of the operational amplifier AMP is connected to the variable resistor Rv via the switch SW. Configurations of the switch SW and the variable resistor Rv can be identical to those shown in FIG. 19.

One ends of the P transistors Tpreset and Tpset are connected to the power supply VAA via the switches SWpreset and SWpset, respectively, and the other ends thereof are connected to the bit lines BL. The P transistors Tpreset and Tpset are used for the write operation (set and reset) of the iPCM, respectively. Gates of the P transistors Tpreset and Tpset are connected in common to the output of the operational amplifier AMP together with the gate of the P transistor Tpref. The P transistor Tpreset flows a current to be used for the reset operation. The P transistor Tpset flows a current to be used for the set operation. For this purpose, the sizes (W/L) of the P transistors Tpreset and Tpset are adjusted.

The resistor Rref_set has a resistance value equal to that of a memory cell in a set state. The resistor Rref_reset has a resistance value equal to that of a memory cell in a reset state.

At the time of writing the set state, the switch SW is changed to apply the set voltage Vset to the operational amplifier AMP. The switches SWref_set and SWpset are turned on. The operational amplifier AMP applies the set voltage Vset to the transistors Tpref and Tpset and the transistor Tpset flows a current corresponding to the set voltage Vset to write the set state to a relevant bit line BL.

At the time of writing the reset state, the switch SW applies the reset voltage Vreset to the operational amplifier AMP. The switches SWref_reset and SWpreset are turned on. The operational amplifier AMP applies the reset voltage Vreset to the transistors Tpref and Tpreset and the transistor Tpreset flows a current corresponding to the reset voltage Vreset to write the reset state to a relevant bit line BL.

In this way, the write driver 40 shown in FIG. 20 changes over the switches SW, SWref_set, SWpset, SWref_reset, and SWpreset according to write of the set state or the reset state. This enables the write driver 40 to apply a supply current corresponding to write of the set state or the reset state to a relevant bit line BL.

In the eleventh embodiment, the read driver 30 and the write driver 40 are separately provided, whereby currents to be flowed to the bit lines BL can be optimized in the read operation and the write operation, respectively. The eleventh embodiment can achieve effects identical to those of the first embodiment.

Twelfth Embodiment

Figure 21:
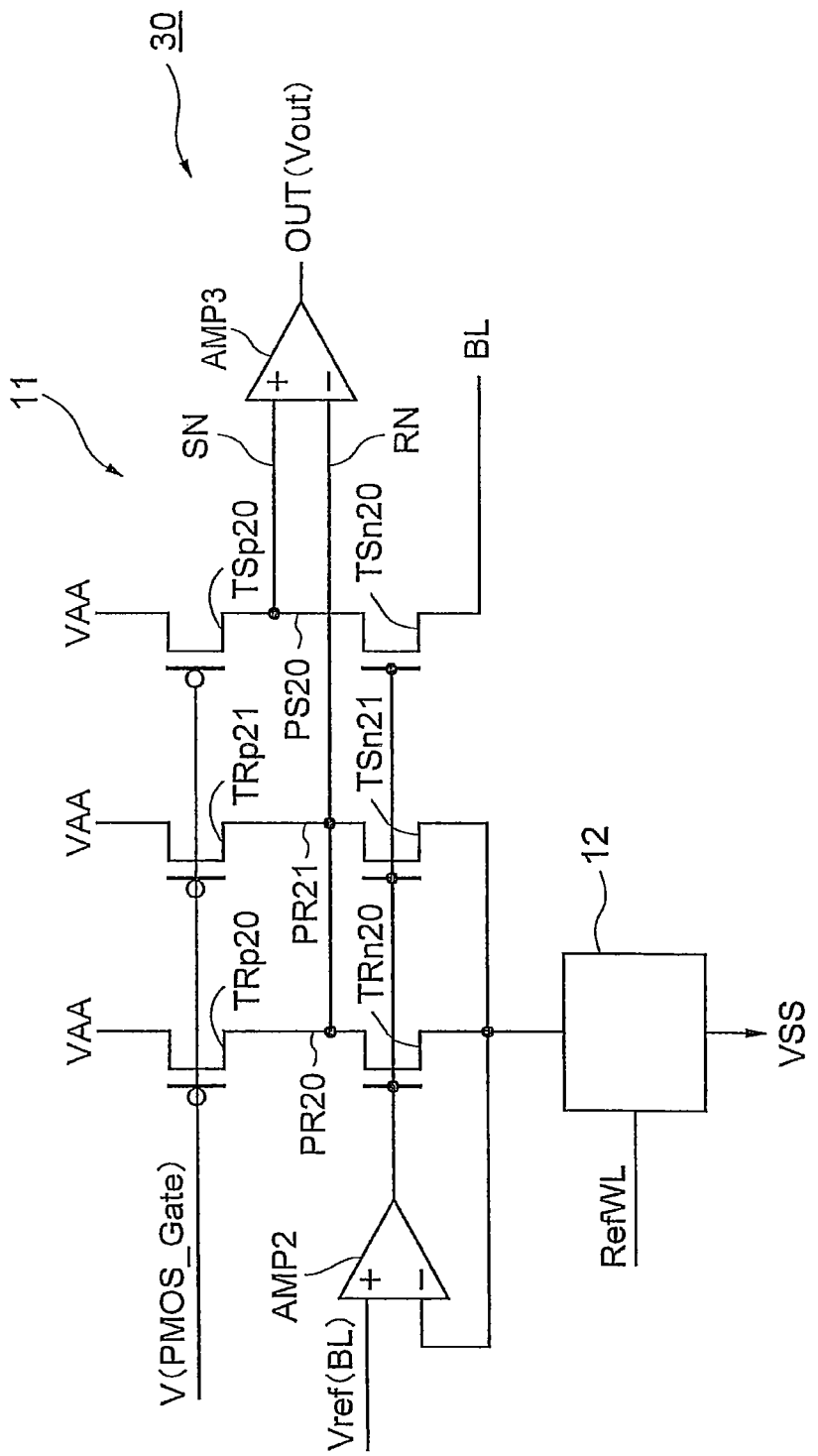
FIG. 21 is a circuit diagram showing an example of a configuration of the read driver 30 according to a twelfth embodiment.

FIG. 21 is a circuit diagram showing an example of a configuration of the read driver 30 according to a twelfth embodiment. The read driver 30 according to the twelfth embodiment includes the current supply circuit 11 that supplies a current to a relevant bit line BL and the current generation circuit (constant current source) 12 that generates a reference current.

The current supply circuit 11 includes reference current paths PR20 and PR21, a supply current path PS20, and the operational amplifiers AMP2 and AMP3.

The reference current path PR20 is connected between the internal step-down power supply VAA and the current generation circuit 12 and has a P transistor TRp20 and an N transistor TRn20 connected in series.

The reference current path PR21 is connected between the internal step-down power supply VAA and the current generation circuit 12 has a P transistor TRp21 and an N transistor TRn21 connected in series.

The supply current path PS20 is connected between the internal step-down power supply VAA and the bit lines BL and has a P transistor TSp20 and an N transistor TSn20 connected in series.

An inverting input of the operational amplifier AMP2 is connected to a node between the reference current paths PR20 and PR21 and the current generation circuit 12. A non-inverting input of the operational amplifier AMP2 is connected to the reference potential Vref(BL). An output of the operational amplifier AMP2 is connected to gates of the N transistors TRn20, TRn21, and TSn20 in common.

An inverting input of the operational amplifier AMP3 is connected to the reference node RN. A non-inverting input of the operational amplifier AMP3 is connected to the sense node SN (the supply current path PS20).

The P transistors TRp20, TRp21, and TSp20 have equal sizes, respectively. The N transistors TRn20, TRn21, and TSn20 also have equal sizes, respectively. Therefore, the reference current paths PR20 and PR21 flow equal reference currents Iref, respectively.

The supply current path PS20 flows a supply current equal to the reference current Iref to a selected bit line BL. An operation (a read operation) of the operational amplifier AMP3 serving as a sense amplifier is as explained with reference to FIG. 2.

The current generation circuit 12 is explained next.

Figure 22:
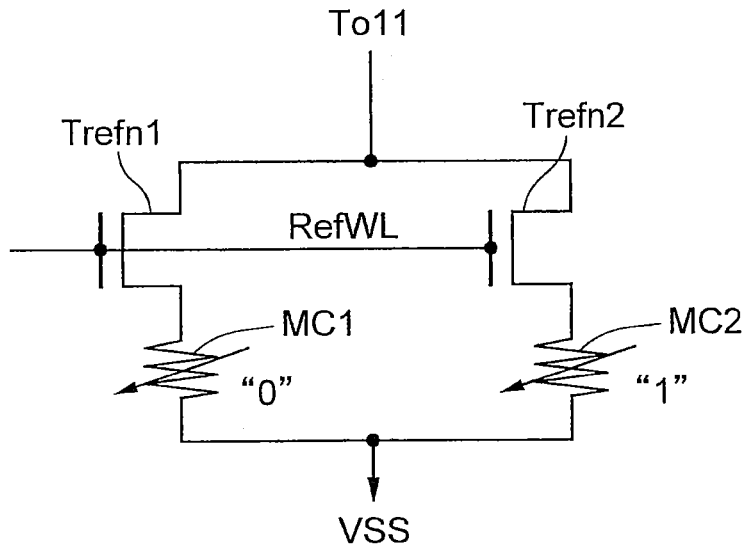
FIG. 22 is a circuit diagram showing an example of a configuration of the current generation circuit 12 according to the twelfth embodiment.

FIG. 22 is a circuit diagram showing an example of a configuration of the current generation circuit 12 according to the twelfth embodiment.

The current generation circuit 12 includes, a first memory cell MC1 that stores therein the data "0", a second memory cell MC2 that stores therein the data "1", and N transistors Trefn1 and Trefn2. The first and second memory cells MC1 and MC2 are connected in parallel between the reference current paths PR1 and PR2 and the low-voltage source VSS via the transistors Trefn1 and Trefn2, respectively. In the twelfth embodiment, the memory cells MC are ReRAMs, PCMs, iPCMs, or the like.

Gates of the transistors Trefn1 and Trefn2 are connected in common and are driven by a signal RefWL. The signal RefWL is a signal that is stepped up to a voltage VPP (VPP≥VAA+Vth) when selected at the time of reading. In this case, Vth is a threshold voltage of the transistors Trefn1 and Trefn2.

It is assumed in this example that the memory cell MC1 storing therein the data "0" is in a low-resistance state and the memory cell MC2 storing therein the data "1" is in a high-resistance state. In this case, when the signal RefWL is stepped up to the voltage VPP to bring the transistors Trefn1 and Trefn2 to conduction, the sum of reference currents becomes the sum of currents flowing through the memory cells MC1 and MC2. Meanwhile, the reference current paths PR20 and PR21 flow equal reference currents Iref, respectively, and thus the reference current Iref becomes the average of the currents flowing through the memory cells MC1 and MC2. That is, the reference current Iref becomes a medium value between the current flowing through the memory cell MC1 that stores therein the data "0" and the current flowing through the memory cell MC2 that stores therein the data "1". The sense amplifier AMP3 compares a potential of the reference node RN connected to the reference current paths PR20 and PR21 with a potential of the sense node SN connected to the corresponding bit line BL, thereby accurately detecting logic of data connected to a selected memory cell.

As described above, in the twelfth embodiment, the memory cell MC1 storing therein the data "0" and the memory cell MC2 storing therein the data "1" are connected in parallel and the average value of the currents flowing in the memory cells MC1 and MC2, respectively, is used as the reference current Iref. Accordingly, the reference current Iref corresponding to variations in element characteristics can be generated. That is, according to the twelfth embodiment, the read driver 30 can generate the reference current Iref in a self-aligned manner with respect to variations in characteristics of elements such as the memory cells MC.

Thirteenth Embodiment

Figure 23:
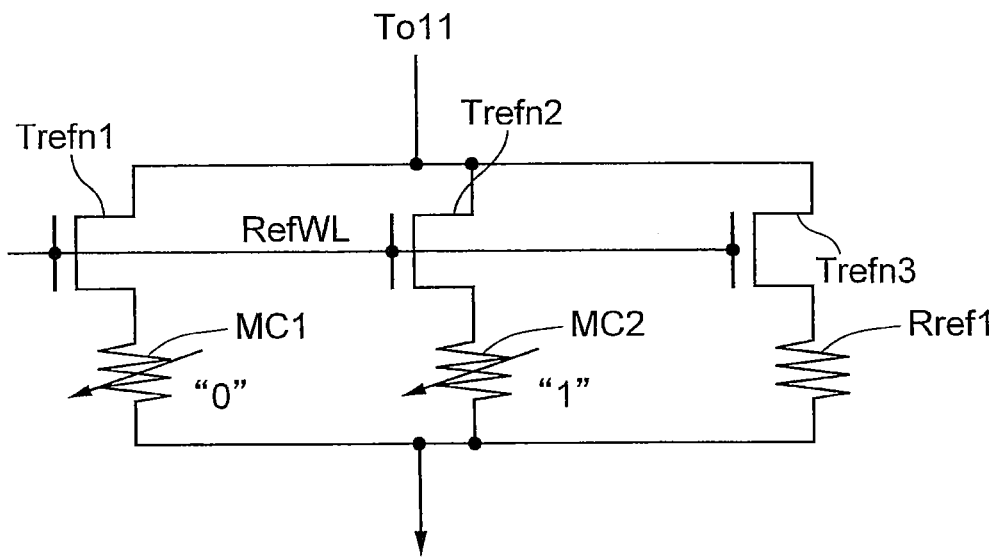
FIG. 23 is a circuit diagram showing an example of a configuration of the current generation circuit 12 according to a thirteenth embodiment.

FIG. 23 is a circuit diagram showing an example of a configuration of the current generation circuit 12 according to a thirteenth embodiment. The current generation circuit 12 according to the thirteenth embodiment further includes a transistor Trefn3 and a resistor Rref1. The transistor Tref3 and the resistor Rref1 are connected in series between the current supply circuit 11 and the low-voltage source VSS.

A gate of the transistor Trefn3 is connected to the gates of the transistors Trefn1 and Trefn2 in common. When the transistors Trefn1 to Trefn3 are brought to conduction, the memory cells MC1 and MC2 and the resistor Rref1 are connected in parallel between the reference current path PR1 (or PR2) and the low-voltage source VSS.

The resistor Rref1 is provided to perform fine adjustment of the reference current Iref. This enables, for example, the reference current Iref to be shifted (offset) from the average value of the currents flowing in the memory cells MC1 and MC2, respectively. In the thirteenth embodiment, the reference current Iref is increased from the average value of the currents flowing in the memory cells MC1 and MC2, respectively. Accordingly, the reference current Iref can be adjusted to maximize a sense margin of the sense amplifier AMP3.

Other configurations of the current generation circuit 12 according to the thirteenth embodiment can be identical to those of the current generation circuit 12 according to the twelfth embodiment. Therefore, the thirteenth embodiment can achieve effects identical to those of the twelfth embodiment.

Fourteenth Embodiment

Figure 24:
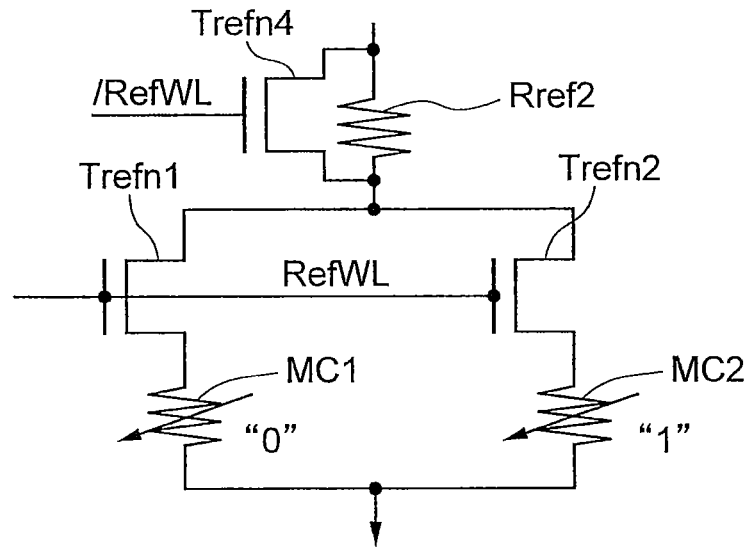
FIG. 24 is a circuit diagram showing an example of a configuration of the current generation circuit 12 according to a fourteenth embodiment.

FIG. 24 is a circuit diagram showing an example of a configuration of the current generation circuit 12 according to a fourteenth embodiment. The current generation circuit 12 according to the fourteenth embodiment further includes a transistor Trefn4 and a resistor Rref2. The transistor Tref4 and the resistor Rref2 are connected in parallel and are connected between the current supply circuit 11 and the transistors Trefn1 and Trefn2 in series therewith.

A gate of the transistor Trefn4 is connected to an inverted signal of the signal RefWL. Accordingly, when the transistors Trefn1 and Trefn2 are brought to conduction, the transistor Trefn4 is not brought to conduction and the reference current flows through the resistor Rref2. When the transistors Trefn1 and Trefn2 are not brought to conduction, the transistor Trefn4 is brought to conduction and almost no current flows to the resistor Rref2.

The resistor Rref2 is provided to perform fine adjustment of the reference current Iref. This enables, for example, the reference current Iref to be shifted (offset) from the average value of the currents flowing in the memory cells MC1 and MC2, respectively. In the fourteenth embodiment, the reference current Iref is decreased from the average value of the currents flowing in the memory cells MC1 and MC2, respectively. Accordingly, the reference current Iref can be adjusted to maximize a sense margin of the sense amplifier AMP3.

Other configurations of the current generation circuit 12 according to the fourteenth embodiment can be identical to those of the current generation circuit 12 according to the twelfth embodiment. Therefore, the fourteenth embodiment can achieve effects identical to those of the twelfth embodiment.

Fifteenth Embodiment

Figure 25:
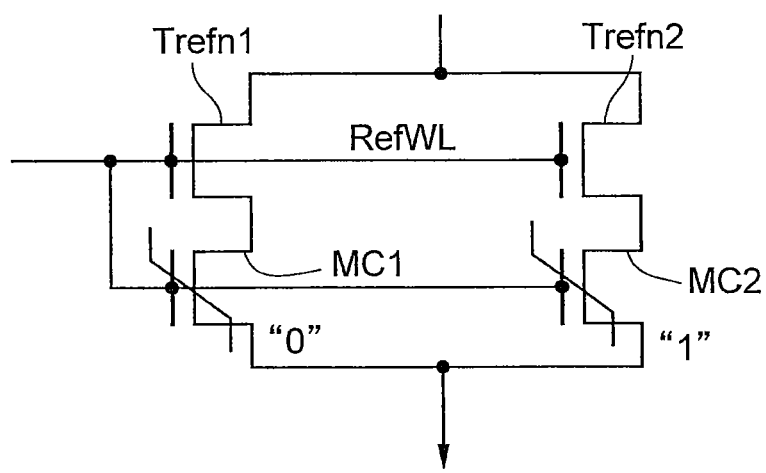
FIG. 25 is a circuit diagram showing an example of a configuration of the current generation circuit 12 according to a fifteenth embodiment.

FIG. 25 is a circuit diagram showing an example of a configuration of the current generation circuit 12 according to a fifteenth embodiment. While ReRAMs, PCMs, or iPCMs are used as the memory cells MC in the above embodiments, FeNANDs are used as the memory cells MC in the fifteenth embodiment. In this case, gates of the memory cells MC1 and MC2 (gates of FeFETs) are connected in common to the signal RefWL together with the gates of the transistors Trefn1 and Trefn2. In this case, the memory cell array MCA is of course configured with FeNANDs.

As described above, even when the memory cells MC are the FeNANDs, the average value of currents flowing in the memory cell MC1 that stores therein the data "0" and the memory cell MC2 that stores therein the data "1", respectively, can be used as the reference current Iref.

Sixteenth Embodiment

Figure 26:
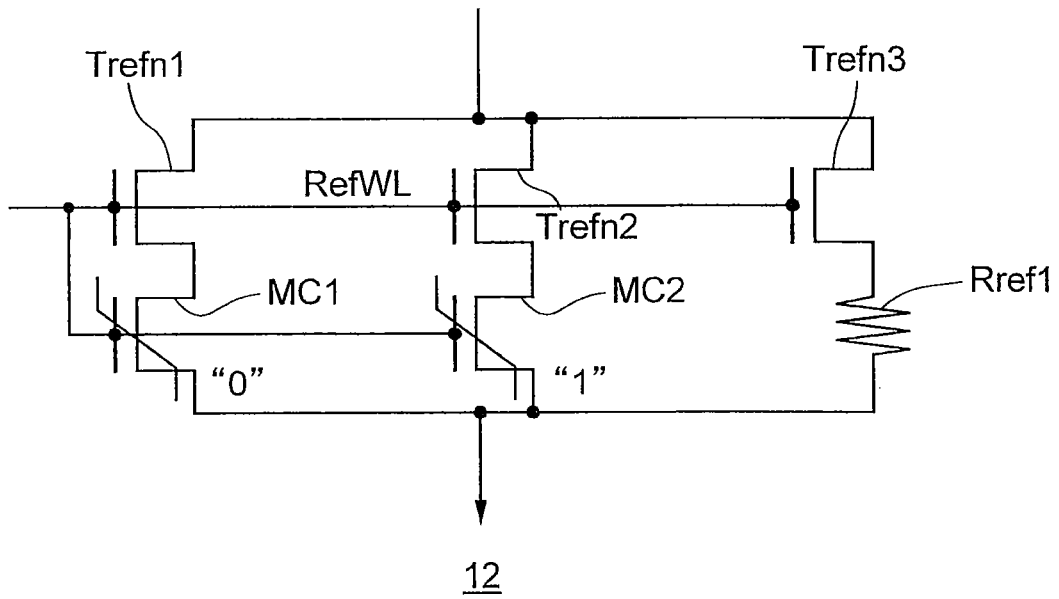
FIG. 26 is a circuit diagram showing an example of a configuration of the current generation circuit 12 according to a sixteenth embodiment.

FIG. 26 is a circuit diagram showing an example of a configuration of the current generation circuit 12 according to a sixteenth embodiment. The sixteenth embodiment is a combination of the thirteenth and fifteenth embodiments.

Accordingly, even when the memory cells MC are FeNANDs, the reference current Iref can be increased (offset) from the average value of currents flowing in the memory cells MC1 and MC2, respectively.

Seventeenth Embodiment

Figure 27:
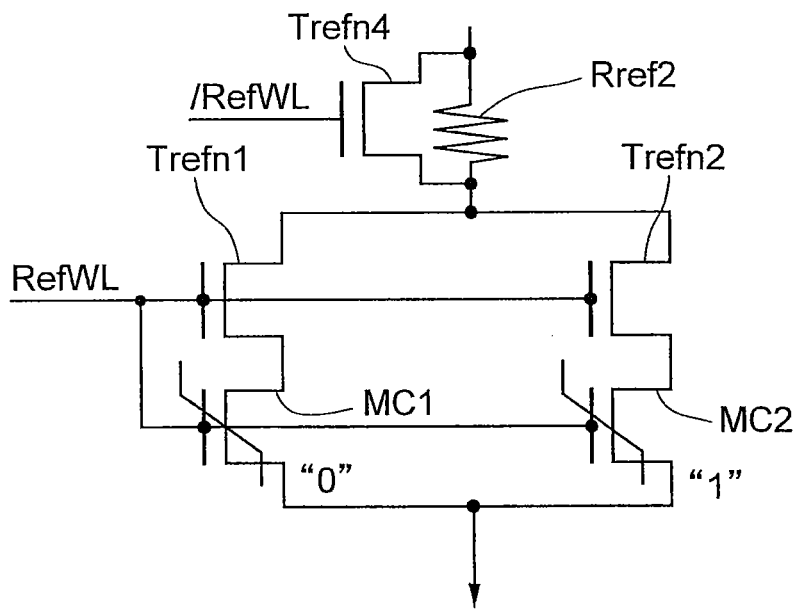
FIG. 27 is a circuit diagram showing an example of a configuration of the current generation circuit 12 according to a seventeenth embodiment.

FIG. 27 is a circuit diagram showing an example of a configuration of the current generation circuit 12 according to a seventeenth embodiment. The seventeenth embodiment is a combination of the fourteenth and fifteenth embodiments.

Accordingly, even when the memory cells MC are FeNANDs, the reference current Iref can be increased (offset) from the average value of currents flowing in the memory cells MC1 and MC2, respectively.

Eighteenth Embodiment

Figure 28:
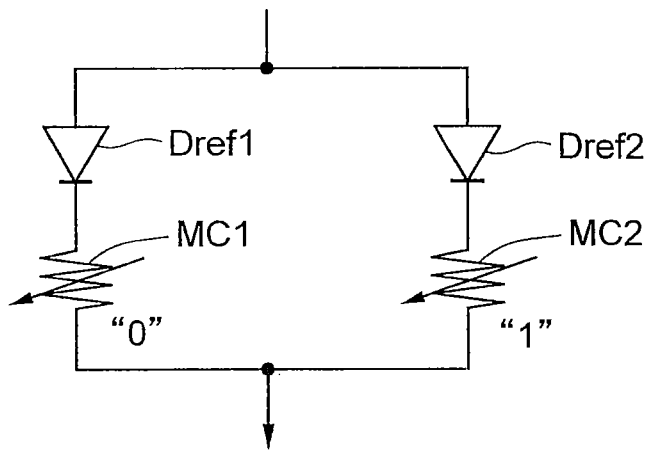
FIG. 28 is a circuit diagram showing an example of a configuration of the current generation circuit 12 according to an eighteenth embodiment.

FIG. 28 is a circuit diagram showing an example of a configuration of the current generation circuit 12 according to an eighteenth embodiment. In the eighteenth embodiment, diodes Dref1 and Dref2 are used as selection elements instead of the transistors Trefn1 and Trefn2. In this case, the memory cell array MCA also uses diodes as selection elements.

Also with this configuration, the current generation circuit 12 can use the average value of currents flowing in the memory cells MC1 and MC2, respectively, as the reference current Iref. Therefore, the eighteenth embodiment can achieve effects identical to those of the twelfth embodiment.

Nineteenth Embodiment

Figure 29:
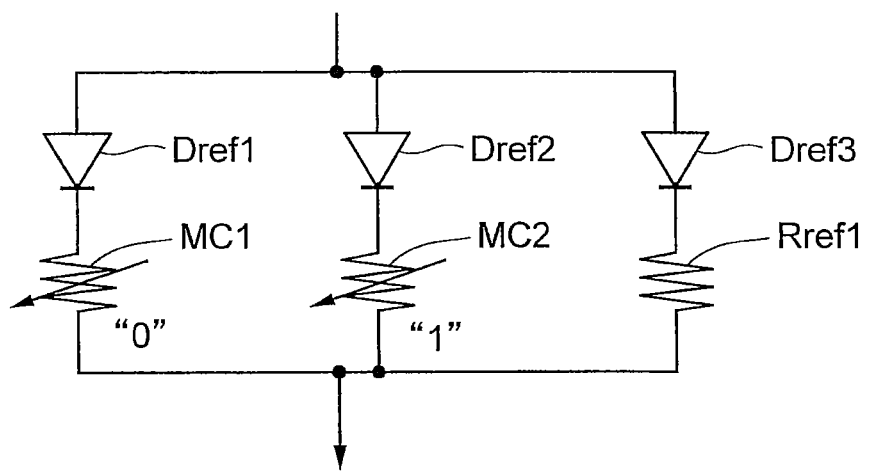
FIG. 29 is a circuit diagram showing an example of a configuration of the current generation circuit 12 according to a nineteenth embodiment.

FIG. 29 is a circuit diagram showing an example of a configuration of the current generation circuit 12 according to a nineteenth embodiment. The nineteenth embodiment is a combination of the thirteenth and eighteenth embodiments. A diode Dref3 and the resistor Rref1 are connected in series between the current supply circuit 11 and the low-voltage source VSS. The resistor Rref1 is provided to perform fine adjustment of the reference current Iref. Accordingly, the nineteenth embodiment can achieve effects identical to those of the thirteenth embodiment.

Twentieth Embodiment

Figure 30:
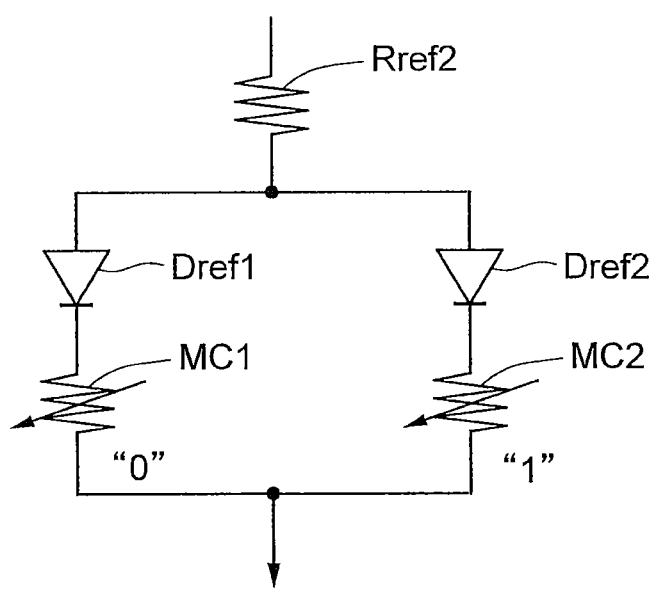
FIG. 30 is a circuit diagram showing an example of a configuration of the current generation circuit 12 according to a twentieth embodiment.

FIG. 30 is a circuit diagram showing an example of a configuration of the current generation circuit 12 according to a twentieth embodiment. The twentieth embodiment is a combination of the fourteenth and eighteenth embodiments. The resistor Rref2 is connected between the current supply circuit 11 and the diodes Dref1 and Dref2. The resistor Rref2 is provided to perform fine adjustment of the reference current Iref. Accordingly, the twentieth embodiment can achieve effects identical to those of the fourteenth embodiment.

Twenty-First Embodiment

Figure 31:
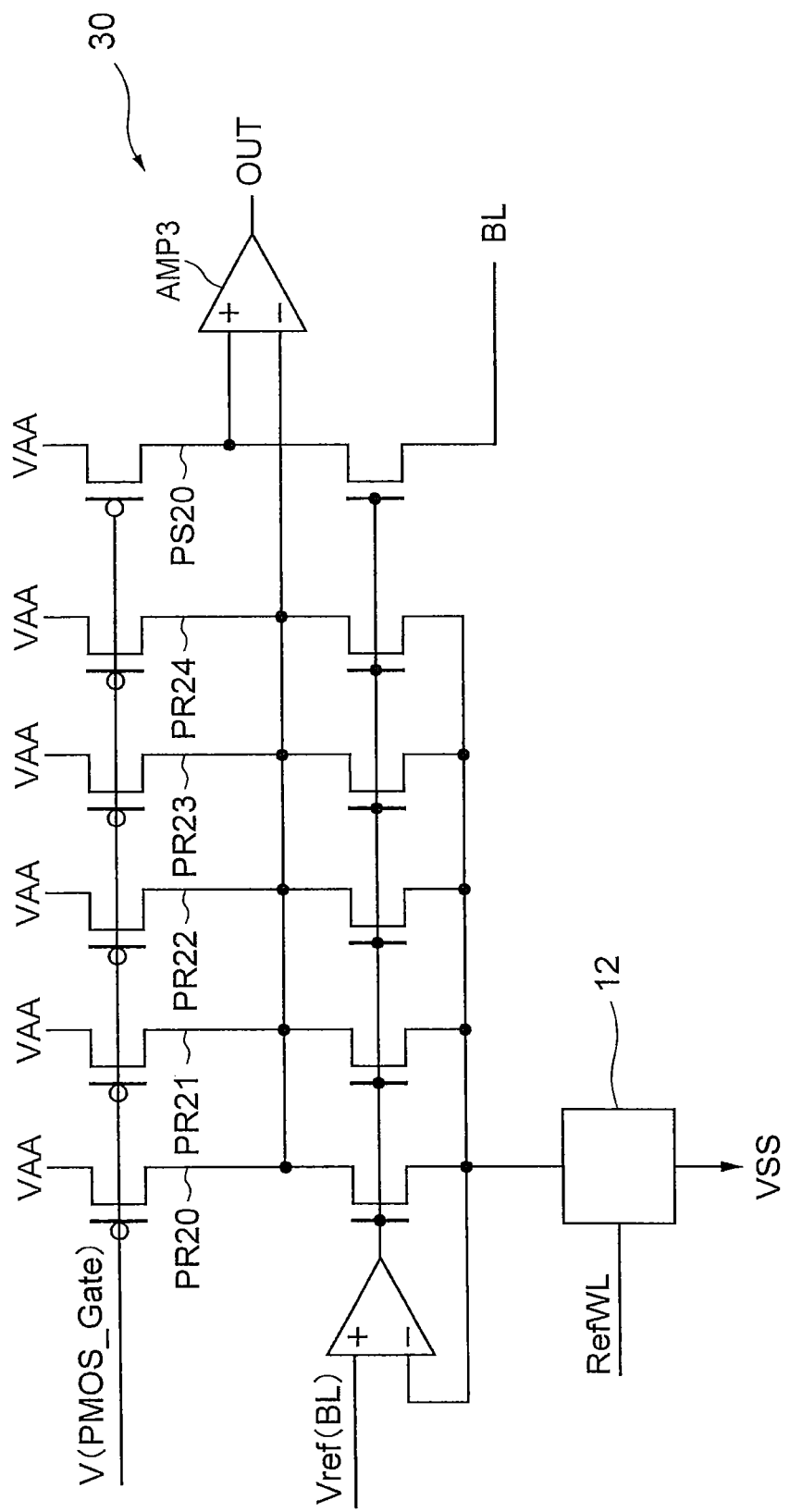
FIG. 31 is a circuit diagram showing an example of a configuration of the read driver 30 according to a twenty-first embodiment.

FIG. 31 is a circuit diagram showing an example of a configuration of the read driver 30 according to a twenty-first embodiment. The current supply circuit 11 according to the twenty-first embodiment includes five reference current paths PR20 to PR24. The reference current paths PR20 to PR24 are connected in parallel between the power supply VAA and the current generation circuit 12 and have the same configuration. In this case, the reference current paths PR20 to PR24 flow the same reference current Iref.

Figure 32:
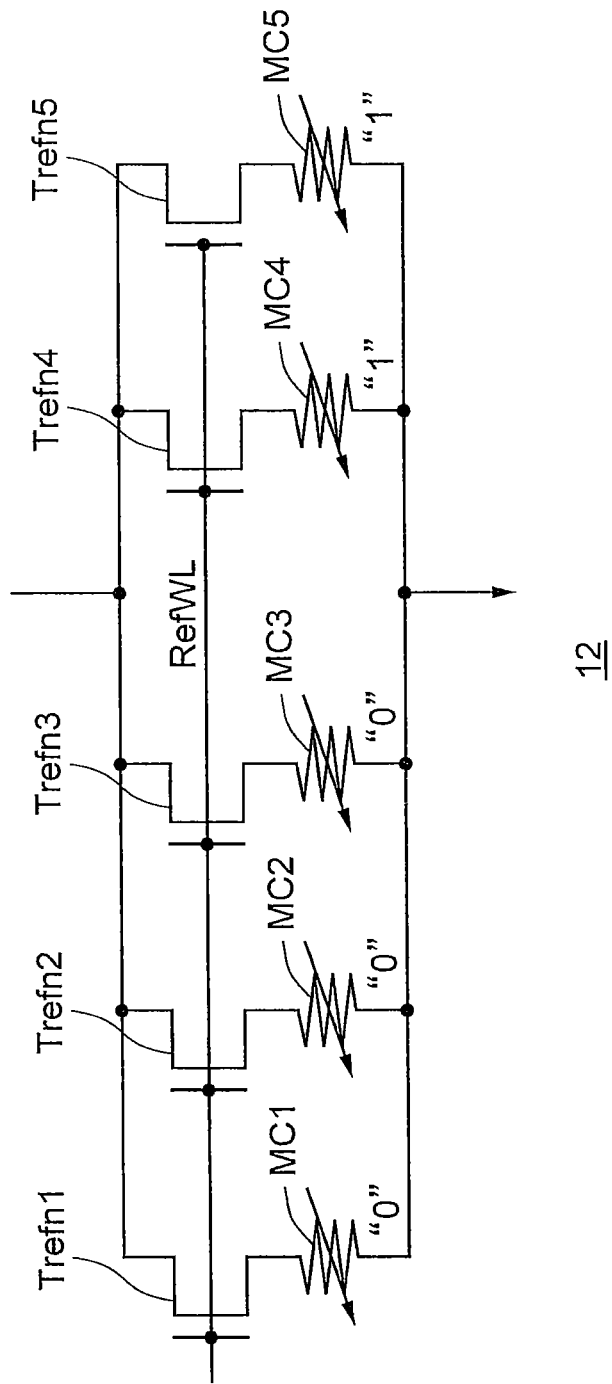
FIG. 32 is a circuit diagram showing an example of a configuration of the current generation circuit 12 according to the twenty-first embodiment.

FIG. 32 is a circuit diagram showing an example of a configuration of the current generation circuit 12 according to the twenty-first embodiment.

The current generation circuit 12 includes three memory cells MC1 to MC3 that store therein the data "0", two memory cells MC4 and MC5 that store therein the data "1", and N transistors Trefn1 to Trefn5. The memory cells MC1 to MC5 are connected in parallel between the reference current paths PR1 to PR5 and the low-voltage source VSS via the transistors Trefn1 to Trefn5, respectively. In the twenty-first embodiment, the memory cells MC are ReRAMs, PCMs, iPCMs, or the like.

Gates of the transistors Trefn1 to Trefn5 are connected in common and are driven by the signal RefWL.

In the twenty-first embodiment, the average value of currents flowing to the three memory cells MC1 to MC3 that store therein the data "0" and the two memory cells MC4 and MC5 that store therein the data "1", respectively, is used as the reference current Iref. That is, the average value of the currents flowing to the five memory cells MC1 to MC5, respectively, is the reference current Iref. In this case, the reference current Iref has a value shifted from the medium value of the currents flowing to the memory cell MC that stores therein the data "0" and the memory cell MC that stores therein the data "1", respectively, toward the side of the data "0". In this way, the reference current Iref can be offset.

Twenty-Second Embodiment

Figure 33:
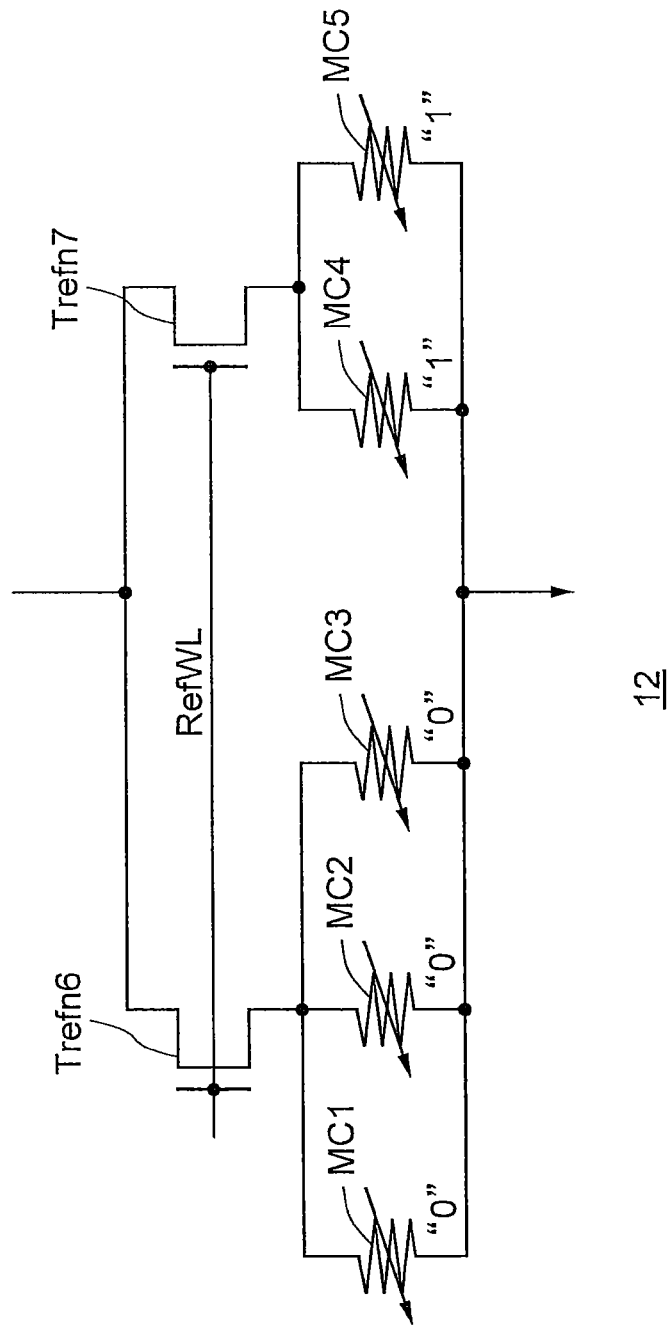
FIG. 33 is a circuit diagram showing an example of a configuration of the current generation circuit 12 according to a twenty-second embodiment.

FIG. 33 is a circuit diagram showing an example of a configuration of the current generation circuit 12 according to a twenty-second embodiment. The current generation circuit 12 according to the twenty-second embodiment is applied to the read driver 30 according to the twenty-first embodiment.

In the twenty-second embodiment, the transistors Trefn1 to Trefn3 are replaced by a transistor Trefn6. The transistors Trefn4 and Trefn5 are replaced by a transistor Trfn7. The transistor Trefn6 is connected between the reference current paths PR1 to PR5 and the memory cells MC1 to MC3. The transistor Trefn7 is connected between the reference current paths PR1 to PR5 and the memory cells MC4 and MC5. Other configurations of the current generation circuit 12 according to the twenty-second embodiment can be identical to corresponding configurations in the twenty-first embodiment. The current generation circuit 12 according to the twenty-second embodiment can achieve effects identical to those of the twenty-first embodiment. According to the twenty-second embodiment, the transistor Trefn6 is common to the memory cells MC1 to MC3 and the transistor Trefn7 is common to the memory cells MC4 and MC5. Therefore, the current generation circuit 12 according to the twenty-second embodiment can have a reduced layout area.

The twenty-first and twenty-second embodiments can be applied to a FeNAND.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims, and their equivalents are intended to cover such forms or modifications as would fall within the scope and spirit of the inventions.

The invention claimed is:

1. A semiconductor storage device comprising:
 a constant current source;
 a reference current path connected to the constant current source to flow a reference current and to generate a reference voltage;
 a supply current path or a plurality of supply current paths connected to bit lines to selectively flow supply a current or currents different from each other and to generate a detection voltage; and
 a sense amplifier connected to the reference current path and the supply current paths to amplify a voltage difference between the reference voltage and the detection voltage, wherein
 the reference current path comprises a first P transistor and a first N transistor connected in series between a power supply and the constant current source,
 a first node between the first P transistor and the first N transistor is connected to one input of the sense amplifier, a first supply current path among the supply current path or the supply current paths comprises a second P transistor and a second N transistor connected in series between the power supply and the bit lines, a second node between the second P transistor and the second N transistor is connected to other input of the sense amplifier, gates of the first and second P transistors are controlled to be at a same potential, and gates of the first and second N transistors are controlled to be at a same potential.

2. The device of claim 1, further comprising a first operational amplifier having one input connected to a reference voltage used for data detection, another input connected between the first P transistor and the first N transistor, and an output connected to the gates of the first and second P transistors.

3. The device of claim 1, further comprising a second operational amplifier having one input connected to a set voltage of the bit lines, another input connected between the first N transistor and the constant current source, and an output connected to the gates of the first and second N transistors.

4. The device of claim 1, wherein
WP1/LP1:WP2/LP2=I1:I2
WN1/LN1:WN2/LN2=I1:I2
where a channel width and a channel length of the first P transistor are WP1 and LP1, respectively, a channel width and a channel length of the first N transistor are WN1 and LN1, respectively, a channel width and a channel length of the second P transistor are WP2 and LP2, respectively, a channel width and a channel length of the second N transistor are WN2 and LN2, respectively, a value of a current flowing through the reference current path is I1, and a value of a current flowing through the supply current paths is I2.

5. A semiconductor storage device comprising:
a constant current source;
a reference current path connected to the constant current source to flow a reference current and to generate a reference voltage;
a supply current path or a plurality of supply current paths connected to bit lines to selectively flow supply a current or currents different from each other and to generate a detection voltage; and
a sense amplifier connected to the reference current path and the supply current paths to amplify a voltage difference between the reference voltage and the detection voltage, wherein
the constant current source comprises a ladder-binary current-addition DA converter.

6. The device of claim 5, wherein the constant current source further comprises a decoder DA converter.

7. A semiconductor storage device comprising:
a constant current source;
a reference current path connected to the constant current source to flow a reference current and to generate a reference voltage;
a supply current path or a plurality of supply current paths connected to bit lines to selectively flow supply a current or currents different from each other and to generate a detection voltage;
a sense amplifier connected to the reference current path and the supply current paths to amplify a voltage difference between the reference voltage and the detection voltage; and
a read driver and a write driver separately, wherein in the read driver,
the reference current path comprises a first P transistor and a first N transistor connected in series between a power supply and the constant current source,
a first node between the first P transistor and the first N transistor is connected to one input of the sense amplifier,
a first supply current path among the supply current path or the supply current paths comprises a second P transistor and a second N transistor connected in series between the power supply and the bit lines,
a second node between the second P transistor and the second N transistor is connected to another input of the sense amplifier,
gates of the first and second P transistors are controlled to be at a same potential, and
gates of the first and second N transistors are controlled to be at a same potential.

8. The device of claim 7, further comprising:
a first operational amplifier having one input connected to a reference voltage used for a data detection, another input connected between the first P transistor and the first N transistor, and an output connected to the gates of the first and second P transistors; and
a second operational amplifier having one input connected to a set voltage of the bit lines, another input connected between the first N transistor and the constant current source, and an output connected to the gates of the first and second N transistors.

9. The device of claim 7, wherein
a gate voltage of the first and second P transistors is input directly from outside, and
a gate voltage of the first and second N transistors is input directly from outside.

10. The device of claim 1, comprising a read driver and a write driver separately, wherein
in the write driver,
the reference current path comprises a first P transistor and a first N transistor connected in series between a power supply and the constant current source,
a first supply current path among the supply current path or the supply current paths comprises a second P transistor and a second N transistor connected in series between the power supply and the bit lines,
gates of the first and second P transistors are controlled to be at a same potential, and
gates of the first and second N transistors are controlled to be at a same potential.

11. The device of claim 10, further comprising an operational amplifier having one input connected to a set voltage of the bit lines, another input connected between the first N transistor and the constant current source, and an output connected to the gates of the first and second P transistors.

12. The device of claim 10, further comprising an operational amplifier having one input connected to a set voltage of the bit lines, another input connected between the first N transistor and the constant current source, and an output connected to the gates of the first and second N transistors.

13. The device of claim 1, comprising a read driver and a write driver separately, wherein
the write driver comprises:
a P transistor connected between a power supply and the bit lines;
a resistor which generates a plurality of write voltages;
an operational amplifier having one input connected to the resistor, another input connected to the bit lines, and an output connected to a gate of the P transistor; and a switch connected between the resistor and the operational amplifier to change a write voltage to be applied to the operational amplifier to any of the write voltages.

14. The device of claim 1, comprising a read driver and a write driver separately, wherein
the write driver comprises:
a reset resistor used for write of a reset state;
a set resistor used for write of a set state;
a first P transistor connected between a power supply and the reset and set resistors;
a first resistor which generates a plurality of write voltages;
an operational amplifier having one input connected to the first resistor, another input connected between the first P transistor and the reset or set resistor, and an output connected to a gate of the first P transistor;
a resetting second P transistor connected between the power supply and the bit lines and having a gate common to the gate of the first P transistor; and
a setting third P transistor connected between the power supply and the bit lines and having a gate common to the gate of the first P transistor,
the reset resistor and the second P transistor are used at a time of writing a reset state, and
the set resistor and the third P transistor are used at a time of writing a set state.

15. The device of claim 1, wherein
a plurality of the reference current paths are provided,
the constant current source comprises:
a first memory cell which stores therein first logic data; and
a second memory cell which stores therein second logic data having opposite logic to the first logic data, and
the first and second memory cells are connected in parallel to each other to the reference current paths.

16. The device of claim 15, wherein
the constant current source further comprises:
a first transistor connected between the reference current paths and the first memory cell; and
a second transistor connected between the reference current paths and the second memory cell, and
gates of the first and second transistors are connected in common to each other.

17. The device of claim 15, wherein
the constant current source further comprises:
a first diode connected between the first memory cell and the reference current paths; and
a second diode connected between the second memory cell and the reference current paths.

18. The device of claim 15, wherein
the first memory cells are connected in parallel in a number of m, and
the second memory cells are connected in parallel in a number of n (m≠n).

19. The device of claim 15, wherein the memory cells are any of a ReRAM, a PCM, an iPCM, an MRAM, a flash memory, and a ferroelectric memory.

* * * * *